United States Patent
Sato

(10) Patent No.: US 6,375,738 B1
(45) Date of Patent: Apr. 23, 2002

(54) PROCESS OF PRODUCING SEMICONDUCTOR ARTICLE

(75) Inventor: Nobuhiko Sato, Sagamihara (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/534,068

(22) Filed: Mar. 24, 2000

(30) Foreign Application Priority Data

Mar. 26, 1999 (JP) ............................................. 11-084652

(51) Int. Cl.⁷ .............................................. C30B 25/18
(52) U.S. Cl. .............................. 117/89; 117/94; 117/95; 117/104; 117/915
(58) Field of Search ............................ 117/89, 104, 915, 117/95, 94

(56) References Cited

U.S. PATENT DOCUMENTS

| | | | |
|---|---|---|---|
| 5,371,037 A | 12/1994 | Yonehara | 437/86 |
| 5,391,257 A | * 2/1995 | Sullivan et al. | 117/915 |
| 5,710,057 A | * 1/1998 | Kenney | 117/915 |
| 5,854,123 A | 12/1998 | Sato et al. | 438/507 |
| 5,856,229 A | 1/1999 | Sakaguchi et al. | 438/406 |
| 5,970,361 A | 10/1999 | Kumomi et al. | 438/409 |
| 6,107,213 A | * 8/2000 | Tayanaka | 438/762 |

FOREIGN PATENT DOCUMENTS

| | | |
|---|---|---|
| EP | 0 757 377 | 2/1997 |
| EP | 0 843 345 | 5/1998 |
| JP | 5-21388 | 1/1993 |
| JP | 7-302889 | 11/1995 |
| JP | 9-102594 | 4/1997 |
| JP | 10-200078 | 7/1998 |

OTHER PUBLICATIONS

K. Sakaguchi, et al., "Eltran® by Splitting Porous Si Layers", Electrochem. Soc. Proc., vol. 99–3, pp. 117–121(1999).

T. Yonehara, et al., "Epitaxial layer transfer by bond and etch back of porous Si", Appl. Phys. Lett., vol. 64, No. 16, pp. 2108–2110 (1994).

* cited by examiner

*Primary Examiner*—Robert Kunemund
(74) *Attorney, Agent, or Firm*—Fitzpatrick, Cella, Harper & Scinto

(57) ABSTRACT

A process of producing a semiconductor article is disclosed which comprises the steps of epitaxially growing on at least one surface of a single-crystal substrate a plurality of single-crystal semiconductor layers differing from each other in at least one of the kind and the concentration of an impurity, making porous the plurality of single-crystal semiconductor layers so as to form a high porosity layer and a low porosity layer, forming a non-porous single-crystal layer on a surface of the single-crystal semiconductor layer as made porous, and bonding and single-crystal substrate and a support substrate to each other, wherein the bonded single-crystal substrate and support substrate are separated at at least one of a location in the high porosity layer and an interface of the high porosity layer with a layer adjacent thereto.

36 Claims, 14 Drawing Sheets

FIG. 10F
FIG. 10H
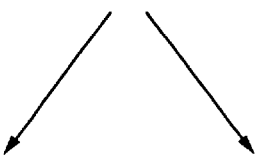
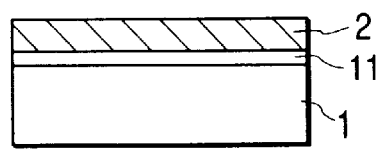
FIG. 10G
FIG. 10I
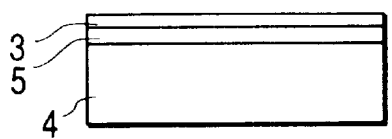
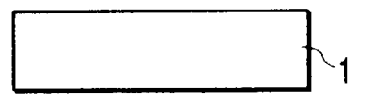

PROCESS OF PRODUCING SEMICONDUCTOR ARTICLE

BACKGROUND OF THE INVENTION

1. Field of the Invention

This invention generally relates to a process of producing a semiconductor article and, more particularly, it relates to a method of producing a semiconductor article in which a single-crystal substrate separated by the method can be reused.

2. Related Background Art

The technique of forming a single-crystal semiconductor layer on an insulator is known as Silicon on Insulator or Semiconductor on Insulator (hereinafter, totally referred to as "SOI") technique and has been investigated by many researchers because devices utilizing the SOI technique have a number of advantages that cannot be obtained by bulk silicon substrates that are used for producing ordinary silicon integrated circuits. In short, the SOI technique provides the advantages of:

(1) easy dielectric isolation and feasibility to a high degree of integration;
(2) excellent radiation hardness;
(3) reduced floating capacitance and adaptability to high speed operation;
(4) capability of omitting a well step:
(5) prevention of latch-ups; and
(6) capability of producing fully depleted type field effect transistors as a result of realizing thin film formation.

Recently, T. Yonehara et al. have reported a bonded SOI that is excellent in film thickness uniformity and crystallinity and can be batch-processed (T. Yonehara et al., Appl. Phys. Lett. Vol. 64, 2108 (1994); U.S. Pat. No. 5,371,037; Japanese Patent Application Laid-Open No. 5-21338).

FIGS. 12A, 12B, 12C, 12D and 12E are schematic sectional views showing the steps of a conventional method of producing a semiconductor article. As shown in FIG. 12A, a porous layer 2 is formed on a surface of an Si substrate 1. As shown in FIG. 12B, a non-porous single-crystal Si layer 3 is epitaxially grown on the porous layer 2. Then, an silicon oxide 5 is formed thereon. Next, as shown in FIG. 12C, the first substrate 1 and a second substrate 4 are bonded to each other.

Then, as shown in FIG. 12D, the first substrate 1 is made thin from the rear side by a technique such as grinding or the like to make the porous layer 2 exposed over the entire surface of the substrate. The exposed porous layer 2 is then etched and removed by a selective etching solution such as HF+$H_2O_2$ or the like. Since the etch selectivity of the porous Si layer 2 relative to the bulk Si (non-porous single-crystal Si) can be made as high as 100,000, the non-porous single-crystal Si layer formed on the porous layer 2 can be left on the second substrate 4 to form an SOI substrate without reducing the thickness of the non-porous single-crystal Si layer (see FIG. 12E).

However, a semiconductor substrate produced by way of the bonding process inevitably requires two wafers, one of which is substantially wasted away by grinding, polishing, etching, or the like.

In order to fully enjoy the advantages of the bonded SOI, there is a continuing need for a process that can produce a high quality SOI substrate with excellent reproducibility and enable the reuse of a prime wafer to attain resource saving and reduction of the production cost. Under such circumstances, Sakaguchi et al. have recently reported a process of reusing a first substrate to be wasted out in the bonding process (Japanese Patent Application Laid-Open No. 7-302889; U.S. Pat. No. 5,856,229).

The uniformity of resistivity of the CZ wafers as silicon substrates which are commercially available easily and inexpensive is relatively good in each wafer but is not satisfactory between wafers. For instance, there is generally used a specification with a variation of ±30–50% such as 0.01–0.02 Ωcm. The specification with a range results from the controllability of variance of resistivity within an ingot. Therefore, when the acceptable value as to variance in resistivity between wafers is to be narrowed, the yield of wafers obtained from one ingot is decreased, thus resulting in an increase of the production cost.

On the other hand, in the steps of forming a porous silicon layer on a surface of a silicon substrate and separating a pair of substrates as bonded in the porous silicon layer, controlling the structure of the porous layer is important in two points.

A first point is the control of the crystallinity of the single-crystal layer as the SOI layer. The crystallinity is greatly influenced by the structure of the porous layer.

That is, silicon materials of different resistivities will form porous layers with different structures, which will affect the density of crystal defects introduced into the non-porous single-crystal layers to be formed thereon. For example, when a porous silicon layer is formed on a substrate doped with boron in about $10^{18}/cm^3$, and an epitaxial silicon layer is formed thereon by the CVD method, a substrate with a resistivity of 0.013 Ωcm and a substrate with a resistivity of 0.017 Ωcm provide crystal defect densities of the epitaxial silicon layers as the SOI layers which are different from each other on the order of about $10^1$.

A second point is the control of the separability. A porous structure suitable for the separation is, for example, a porous layer with a high porosity. However, a high porosity means in most cases that the side walls of the pores are thin, and too high a porosity will results in peeling off at the porous layer prior to the separation, which poses a problem in the step stability.

Especially, the increase of the pore diameters of the porous material is complementary to the decrease of the pore wall thickness, and in case of a high porosity layer, the affection of the change in resistivity, i.e., the change in impurity concentration on the porosity is larger than that in case of a low porosity layer.

Japanese Patent Application Laid-Open Nos. 9-102594 and 10-200078 disclose a method of diffusing an impurity such as boron, etc. to form a uniform porous layer in a low-grade Si substrate with good reproducibility.

The method is described with reference to FIGS. 13A, 13B, 13C, 13D, and 13E.

As shown in FIG. 13A, a doped layer 11 is formed by diffusion or epitaxial growth on a surface of a silicon wafer 1 as a prime wafer.

As shown in FIG. 13B, the silicon substrate 1 having the doped layer 11 is subjected to anodization to form a porous region 2. Since the pore formation is carried out such that the thickness t2 of the porous region 2 is larger than the thickness t1 of the doped layer 11, the porous region 2 consists of two layers 12 and 13 having different porosities from each other.

As shown in FIG. 13C, a non-porous layer 3 is epitaxially grown on the porous region 2, and an insulating layer 5 is formed on a surface thereof.

As shown in FIG. 13D, the insulating layer 5 is bonded to a support substrate 4 to make a bonded substrate.

As shown in FIG. 13E, an external force is applied so as to separate the bonded substrate to generate a crack in the porous region 2, thus effecting separation into two members.

Removing the remaining porous layer 12 and smoothing the exposed surface provides an SOI substrate.

The separated silicon substrate 1, when subjected to removal of the remaining porous layer 13 and smoothing of the exposed surface, can be reused as a silicon wafer (prime wafer) 1 not made porous.

However, since at least the porous layer 13 is obtained by making porous the surface of the original silicon substrate 1, the silicon substrate 1 subjected to the removal of the remaining porous layer 13 is in thickness that the original substrate.

Further, when the impurity concentrations of the used silicon substrates themselves differ from one another, the obtained porous layers 13 are nonuniform ones.

When the separated substrate 1 is to be reused, it is preferable that the quality thereof is suitable for bonding as with the original substrate, and further that the quality of the non-porous single-crystal layer formed on the porous layer is at least not inferior to the quality of that formed on the original substrate 1.

The treatment for making the separated substrate 1 reutilizable is referred to as "reclaiming". The thickness of the reclaimed substrate 1 is reduced at least by the thickness of the porous layer transferred to the support substrate 4 in the separation. In addition, removing the porous layer at the substrate 1 side reduces the thickness of the substrate 1 by the thickness of the portion originally made porous.

Further, when the removal of the porous layer is followed by polishing or the like as the surface flattening treatment of the substrate 1, the thickness of the substrate 1 is further reduced including the reduction in thickness due to the polishing of the porous layer. That is, when reutilized n times, and when the reduction in thickness for each reutilization is defined as t, the thickness of the substrate 1 is reduced by n × t.

Therefore, the number of times of reutilization of the substrate 1 is at most limited within such a range that the thickness of the substrate 1 is not less than a thickness sufficient to withstand the substrate transportation during the semiconductor substrate production process.

Further, it has been frequently reported that when forming the porous layer on the substrate 1, a warpage is found in the semiconductor substrate having the porous layer formed thereon. The warpage is defined by the thicknesses of the porous layer and the substrate 1 as well as the structure of the porous layer. The smaller the thickness of the substrate 1, the larger the warpage.

In the case of the method of bonding a substrate and a support substrate to each other without use of an adhesive, the substrate surfaces are made opposite to each other, are brought into contact with each other and bonded by the Van der Waals force. In this case, an excessively large warpage hinders the bonding.

Further, when adopting the method of effecting separation by application of an external mechanical force, the optimal values of separating conditions vary depending on the substrate thickness, so that substrates as made thin by the regeneration are required to be processed separately from the original substrates.

That is, when n times of regeneration is possible, n kinds of separating conditions need to be set at the maximum. Further, substrates of different thicknesses can not be processed together, and introducing reclaimed substrates into the production makes the process at the production site complicated.

As the substrate for forming a porous layer, it is preferable to use the CZ substrates which are inexpensive and easily available as described above.

The nonuniformity of impurity concentration in an ingot resulting from an impurity concentration nonuniformity generated at the solid-liquid interface when lifting up the ingot from an Si melt by the CZ method is generally called "swirl". The swirl generates a waviness-like surface unevenness along the swirl due to a difference in etch rate delicately generated by the variance of concentration during chemical mechanical polishing or chemical cleaning especially when producing a highly doped wafer.

The surface unevenness develops during the formation of a porous layer. This is because the formation rate of the porous layer is influenced by the impurity concentration, so that there is generated a distribution of the thickness or structure of the porous layer along the swirl. That is, when after removal of the porous layer, a flattening treatment is carried out by a method involving substantially no reduction of film thickness such as heat treatment in a reducing atmosphere containing hydrogen, there is formed on the surface of the reclaimed substrate a swirl-like surface unevenness which is larger than the original one.

This unevenness generates an unbonded region called "void" in the bonding step to result in lowering in the yield of the bonding step, which in turn leads to lowering in the yield of the whole steps.

In order to make small the in-plane distribution of the porous structure or thickness due to the swirl, it is effective that after a silicon wafer is made by the CZ method, an impurity is added to effect control.

The method of thermally diffusing an impurity in a surface layer of a silicon substrate by the diffusion method does not generate the in-plane distribution of the impurity concentration characteristic of the CZ method but is associated with the following problems.

For example, when a layer added with boron in about $10^{18}/cm^3$ is formed in a surface of a silicon wafer in a thickness of 10 $\mu$m, it takes several ten hours to effect diffusion although boron is an impurity with a relatively large diffusion coefficient. Thus, the problem of processing capacity or cost arises.

Further, when such an impurity diffused layer is to be formed in as a short period of time as possible, the concentration at a portion in the vicinity of the surface will reach $10^{19}$–$10^{20}/cm^3$ at the initial stage of diffusion, which may result in crystal defects due to lattice strain accompanying impurity addition at a high concentration. Further, when a higher heat treating temperature is adopted, there is a possibility that the same problem may arise, and there is a case where the substrate is contaminated with reaction pipes of the heat treating apparatus or a metallic impurity permeating through the reaction pipes.

FIGS. 14A, 14B, 14C, 14D, and 14E illustrate another process of producing a semiconductor article.

As shown in FIG. 14A, a non-porous layer 11 having a uniform impurity concentration is formed by the epitaxial growth on a surface of a silicon substrate 1 in a thickness of t3.

As shown in FIG. 14B, a surface of the non-porous layer 11 is anodized to form a porous region 2 in a thickness of t2. At this time, making higher the current density during the anodization enables a low porosity layer 12 and a high porosity layer 13 to be formed in the porous region 2. Since t3 is larger than t2 (t3>t2), the non-porous layer 11 remains in part under the high porosity layer 13.

As shown in FIG. 14C, another non-porous layer 3 and an insulating layer 5 are formed thereon.

As shown in FIG. 14D, the silicon substrate 1 is bonded to a support substrate 4 to make a bonded substrate.

As shown in FIG. 14E, the bonded is separated.

Removing the remaining low porosity layer 12 provides an SOI substrate, while removing the remaining high porosity layer 13 reclaims the silicon substrate 11.

However, when forming porous layers having porosities different from each other, greatly changing the current or the HF concentration during the anodization treatment makes the production cost higher and also makes the maintenance or management complicated.

Further, there is a need for improving the porous layer removal step and the SOI layer smoothing step as compared with the prior art methods.

SUMMARY OF THE INVENTION

An object of the present invention is to provide a process of producing a semiconductor article that can form a uniform low porosity layer and a uniform high porosity layer.

Another object of the present invention is to provide a process of producing a semiconductor article that does not reduce the thickness of an original substrate for each reutilization.

Still another object of the present invention is to provide a process of producing a semiconductor article that is easy in condition setting and maintenance during anodization and can be carried out at a low operation cost.

According to a first aspect of the present invention, there is provided a process of producing a semiconductor article comprising the steps of: epitaxially growing on at least one surface of a single-crystal substrate a plurality of single-crystal semiconductor layers differing from each other in at least one of the kind (species) and the concentration of an impurity; making porous the plurality of single-crystal semiconductor layers so as to form a high porosity layer and a low porosity layer;

forming a non-porous single-crystal layer on a surface of the single-crystal semiconductor layer as made porous; and bonding the single-crystal substrate and a support substrate to each other, wherein the bonded single-crystal substrate and support substrate are separated at at least one of a location in the high porosity layer and an interface of the high porosity layer with a layer adjacent to the high porosity layer.

According to the present invention, by forming on at least one surface of a single-crystal substrate non-porous single-crystal semiconductor layers prior to porous layer formation, and forming a high porosity layer and a low porosity layer, it is possible to suppress the variance in the same substrate or between substrates of the resistivity of a region for forming the porous member.

Further, by forming a single-crystal semiconductor layer in a thickness equal to or larger than the thickness of the porous layer prior to formation of the high porosity and low porosity layers, it is possible to prevent the original thickness of a firstly provided single-crystal substrate from decreasing.

In addition, by forming the single-crystal semiconductor layer of at least two sub-layers differing from each other in at least one of the kind and the concentration of an impurity, it is possible to change the porous layer structure even under the same anodization conditions to thereby increase the reproducibility of the location for generation of a crack, thus making constant the location for separation in the porous layer and/or at the interface of the porous layer with another layer adjacent thereto.

Yet still another object of the present invention is to provide a process of producing a semiconductor article that makes it easy to remove the porous layer and to smooth a surface of the non-porous single-crystal layer transferred onto the support substrate.

According to a second aspect of the present invention, there is provided a process of producing a semiconductor article comprising the steps of: epitaxially growing a single-crystal semiconductor layer on at least one surface of a single-crystal substrate; making porous the single-crystal semiconductor layers to form a high porosity layer and a low porosity layer; forming a non-porous single-crystal layer on a surface of the high porosity layer; and bonding the single-crystal substrate and a support substrate to each other, wherein the bonded single-crystal substrate and support substrate are separated at at least one of a location in the high porosity layer and an interface of the high porosity layer with a layer adjacent to the high porosity layer.

According to a third aspect of the present invention, there is provided a process of producing a semiconductor article comprising the steps of: epitaxially growing a single-crystal semiconductor layer on at least one surface of a single-crystal substrate; effecting heat treatment in a reducing atmosphere comprising hydrogen and then making porous the single-crystal semiconductor layer so as to form a high porosity layer and a low porosity layer; forming a non-porous single-crystal layer on a surface of the high porosity layer; and bonding the single-crystal substrate and a support substrate to each other, wherein the bonded single-crystal substrate and support substrate are separated at at least one of a location in the high porosity layer and an interface of the high porosity layer with a layer adjacent to the high porosity layer.

BRIEF DESCRIPTION OF THE DRAWINGS

FIGS. 10A, 10B, 10C, 10D, 10E, 10F, 10G, 10H and 10I are schematic sectional views illustrating the steps of yet still another example of the process of producing a semiconductor article in accordance with the present invention;

DETAILED DESCRIPTION OF THE PREFERRED EMBODIMENTS

Now, the present invention will be described in greater detail in terms of preferred modes and different phases of carrying out the invention. However, it will be appreciated that the present invention is by no means limited thereto and covers any other modes of realizing the invention that can be used for the purpose of the invention.

A preferred embodiment of the present invention is described with reference to FIGS. 1A to 1E.

Figure 1A:
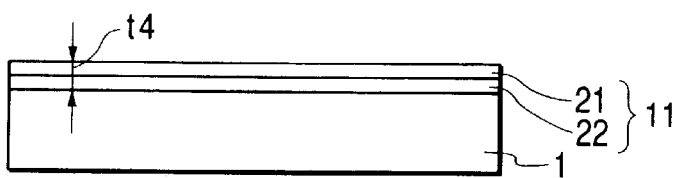
FIGS. 1A, 1B, 1C, 1D and 1E are schematic sectional views illustrating the steps of an example of the process of producing a semiconductor article in accordance with the present invention.

As shown in FIG. 1A, a single-crystal substrate 1 is provided, and a non-porous single-crystal semiconductor layer 11 having a thickness of t4 is formed thereon by the epitaxial growth. Here, the single-crystal semiconductor layer 11 comprises a plurality of layers 21 and 22 which have been made different from each other in the kind and/or concentration of an introduced impurity by changing the epitaxial growth conditions during the growth.

[Single-Crystal Substrate]

As the single-crystal substrate 1, there are preferably used those single-crystal semiconductors which have such a high quality that irregularities such as crystal defects or the like are not introduced into the epitaxial growth layer as subsequently formed. Since it is possible to effect the growth under the conditions such that COPs (Crystal Originated Particles) are not propagated to the epitaxial growth layer, the single-crystal substrate may contain COPs.

Further, the kind and concentration of the impurity of the single-crystal semiconductor is not particularly limited as long as it is within a range that does not affect the anodization step. However, it is preferable that the resistivity of the back surface side of the substrate is low during porous layer formation in the anodization. Specifically, it is preferable that the impurity is added to the degenerate level, and that the resistivity is about 0.1 Ωcm or less.

Incidentally, the single-crystal substrate 1 may be a substrate (reclaimed prime wafer) obtained by removing a porous layer from a prime wafer with the porous layer which is obtained by the steps of forming a non-porous single-crystal layer on a porous silicon layer of the prime wafer, bonding it to a support substrate and effecting separation in the porous layer.

For example, the single-crystal substrate may be p-type or n-type silicon wafers of various impurity concentrations.

[Single-Crystal Semiconductor Layer]

Next, the single-crystal semiconductor layer 11 formed by the epitaxial growth is described.

In the present embodiment, a single-crystal semiconductor layer is formed by the epitaxial growth on at least one surface of the single-crystal substrate 1 in advance of porous layer formation. The growth method is not particularly limited and may include CVD, sputtering, MBE, and so on. When two single-crystal semiconductor layers are to be formed, it is preferred, for example, that a low impurity concentration layer having a relatively low concentration of a p-type impurity is grown as the layer 22 and a high impurity concentration layer having a relatively high concentration of an n-type impurity is grown as the layer 21.

A moderate impurity concentration layer (not shown) having a moderate concentration of an impurity may be formed between the layers 21 and 22, and a layer (not shown) having a lower impurity concentration than the impurity concentration of the layer 22 may be formed between the layer 22 and the substrate 1.

The upper limit of the thickness of the high impurity concentration layer is preferably 20 μm, more preferably 5 μm, and most preferably 2 μm, with the lower limit being preferably 100 μnm.

The upper limit of the thickness of the low impurity concentration layer is preferably 20 μm, more preferably 1 μm, and most preferably 0.5 μm, with the lower limit being preferably 10 nm.

However, since the main purpose of the formation of the single-crystal semiconductor layer 11 in the present embodiment is to control the porosity, more specifically the pore diameter and pore density of the porous layer 2 as subsequently formed, it is desired that the concentration of the electrically activated one of the p-type or n-type impurity added during the growth has a good in-plane distribution. The porosity may be defined as the percentage of the volume of the pores to the volume of the porous member.

Specifically, it is necessary that the in-plane distribution of the concentration in the same substrate as well as the between substrates is preferably within ±10%, and more preferably within ±5%. It is also necessary that at least such a uniformity as to correspond to the concentration variance is obtained when measured in terms of the resistivity of the epitaxial growth layer.

It is necessary that the thickness of the single-crystal semiconductor layer 11 is at least equal to that of the porous layer 2 as subsequently formed. This is because if the thickness of the layer 11 is substantially equal to that of the porous layer 2, the thickness of the layer 11 will not substantially change in the present embodiment, so that limitless number of times of utilization of the layer 11 becomes possible in principle. When the yield is assumed to be 100% and the number of times of utilization as the single-crystal substrate 11 is defined as n, the number of substrates necessary for one SOI substrate is (1+1/n). When utilized ten times, the necessary number is 1.1.

Further, when the layer 11 is formed of two or more sub-layers by changing at least one of the composition, impurity concentration and kind of the single-crystal semiconductor layer 11, the porous layer 2 formed in the layer 11 may have a porous layer structure of two or more layers of different structures. This makes it possible to define the location for the separation in the porous layer.

The material of the single-crystal semiconductor layer includes, for example, an element semiconductor or compound semiconductor of the Group IV element such as Si, $Si_xGe_{1-x}$, Ge, SiC, or the like. The p-type impurity to be added includes B, Ga, Al, etc with B being preferably used.

The n-type impurity to be added includes P, As, Sb, etc. but is particularly limited thereto. In addition to the Group IV element or compound, the Group III-V or II-VI compound semiconductor such as GaAs, InP, etc. may be used.

The boron concentration suitable for forming the low porosity layer 21 is $2.5 \times 10^{17} cm^{-3}$ to $1.2 \times 10^{20} cm^{-3}$ for attaining the resistivity of 0.001–0.1 Ωcm.

The boron concentration suitable for forming the high porosity layer 22 is preferably $1.5 \times 10^{12} cm^{-3}$ to $3.5 \times 10^{18} cm^{-3}$ for attaining the resistivity of 0.02–10000 Ωcm.

In the CVD method, hydrogen added with a silicon source gas and an impurity gas (e.g., $B_2H_6$, $PH_3$, $AsH_3$, etc.) is supplied onto a heated wafer to form an epitaxial growth layer.

The addition amount of diborane varies depending on the growth conditions of the epitaxial growth layer. For example, the decomposition percentage of diborane varies depending on the temperature during the growth and the ratio of incorporation into the epitaxial layer varies. Further, the addition amount of diborane varies depending on the growth rate of the epitaxial silicon which in turn varies depending on the species of the silicon source gas (e.g., $SiCl_4$, $SiHCl_3$, $SiH_2Cl_2$, $SiH_4$, $Si_2H_6$, etc.), concentration of gas flow (silicon source gas flow rate/hydrogen flow rate), flow rate, pressure, temperature, and the like. That is, at the same addition amount of diborane, the larger the epitaxial layer growth rate, the smaller the boron concentration in the epitaxial layer.

An example of the conditions for controlling the boron concentration in the epitaxial layer is shown below.

For example, when a P-type silicon layer of 0.015 Ωm is formed in a piece to piece type CVD apparatus, the conditions are as follows.

Temperature: 1,100° C.
Pressure: 760 Torr ($1.0 \times 10^5$ Pa)
Hydrogen: 42 slm
$SiHCl_3$: 10 g/min
$B_2H_6$: 60 sccm
Growth Rate: 3 μm/min Under the above conditions, a boron concentration of $4 \times 10^{18} cm^{-3}$ is attained, and boron is contained in the silicon crystal at a concentration of about 10 ppm. The boron concentration in the gas phase at this time is 1400 ppm.

On the other hand, a $P^-$-type silicon layer of 0.5 Ωm can be formed using the same conditions as shown above except that the flow rate of $B_2H_6$ is set to be 0.4 sccm.

Under the above conditions, a boron concentration of $3 \times 10^{16} cm^{-3}$ is attained, and boron is contained in the silicon crystal at a concentration of about 10 ppm. The boron concentration in the gas phase at this time is 2.4 ppm.

The above described conditions can suitably be selected from the following ranges.

The range of temperature is preferably 600° C. to 1200° C., and more preferably 800° C. to 1100° C. The range of pressure is preferably $1.3 \times 10^2$ Pa to $1.1 \times 10^5$ Pa, and more preferably $6.6 \times 10^2$ Pa to $1.0 \times 10^5$ Pa. As the silicon source gas, there are preferably used $SiCl_4$, $SiHCl_3$, $SiH_2Cl_2$, $SiH_4$, $Si_2H_6$, or the like. As the dilution gas, hydrogen is most preferably used, but an inert gas such as He, Ar, or the like can be used. Further, nitrogen may possibly be used at a low temperature (100° C. or less), although it will form a nitride on a silicon surface at higher temperatures. In general, with decreasing temperature, the growth rate decreases, while the incorporation efficiency of boron into the silicon crystal does not decrease. Thus, even when the diborane concentration in the gas phase is the same, it is possible to form an epitaxial silicon layer with a relatively high boron concentration.

Figure 1B:
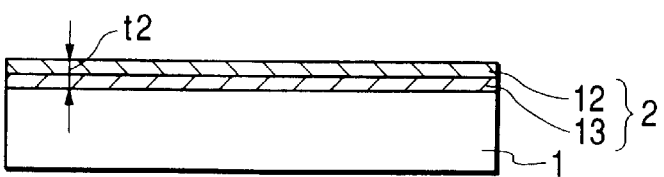

Next, as shown in FIG. 1B, the porous layer 2 is formed.

[Porous Layer]

As the method of forming the porous member, the well known anodization method is used.

For example, the single-crystal substrate 1 having the non-porous single-crystal semiconductor layer 11 formed thereon is dipped into an anodizing solution, and a positive voltage is applied to the substrate 1 and a negative voltage is applied to a counter electrode to generate an electrochemical reaction, so that pores are grown from the surface of the layer 11 to the inside.

The porous Si of the porous semiconductor can be formed by anodization of an Si substrate in an HF solution. The porous layer has a sponge-like structure in which pores with a diameter of about $10^{-1}$–10 nm are arranged at intervals of about $10^{-1}$–10 nm. While the density of single-crystal Si is typically 2.33 g/cm$^3$, the density of the porous Si can be varied within the range of 2.1–0.6 g/cm$^3$ by changing the concentration of hydrofluoric acid between 50 vol % and 20 vol %, changing the addition percentage of an alcohol, and/or changing the current density.

Figure 2:
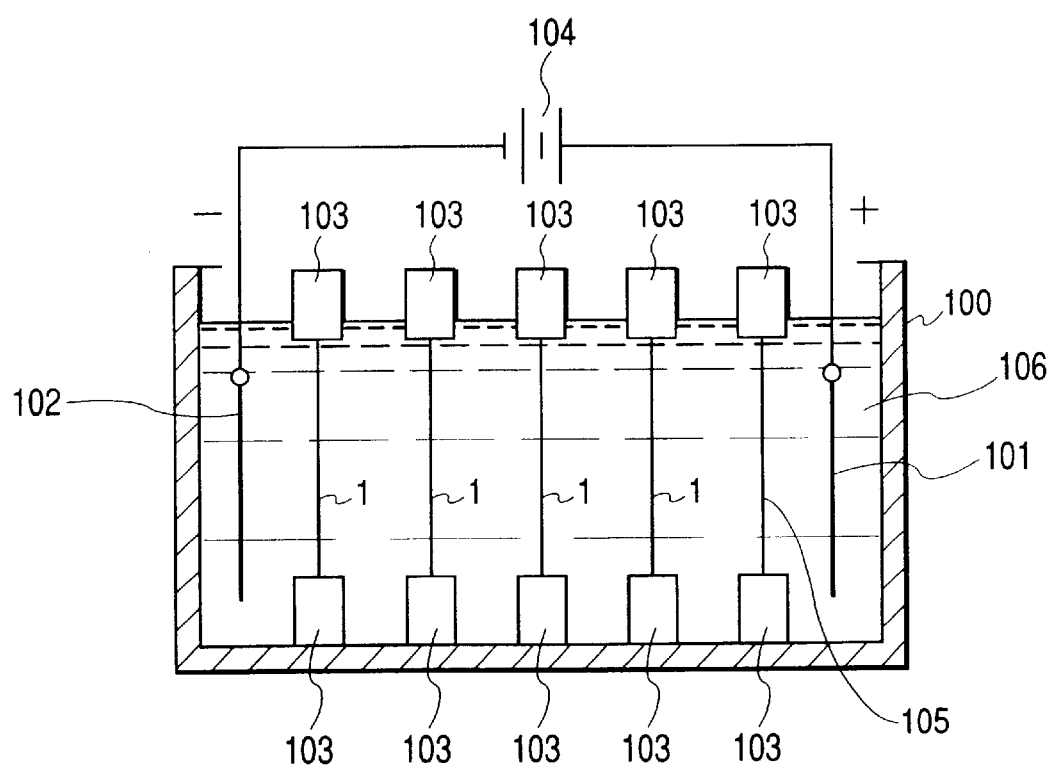
FIG. 2 is a schematic sectional view showing the structure of an anodization apparatus used in the present invention.

FIG. 2 is a schematic view showing the state of anodization. As shown in FIG. 2, a plurality of substrates 1 are arranged in an anodizing solution 106 in a vessel 100. At this time, in order to prevent metal ions solved out from the anode 101 from depositing on the back surface of the substrates 1, a silicon wafer is arranged as a shield wafer 105 on the anode 101 side. In the figure, reference numeral 102 denotes a cathode, 103 wafer holders, 104 a power source for the anodization.

When two or more porous layers are formed by changing the current density, there is a case where the same layer structure is formed in the surface of the shield wafer 105. Thus, when the shield wafer 105 is used n times, 2n porous layers will be formed in the shield wafer 105 and the strength of the 2n porous layers is very unstable.

For example, there is a case where in the (n+1) th use, the porous layers formed in the shield wafer are peeled off and scattered in the vessel. Especially when a low porosity layer and a high porosity layer are alternatively formed in the shield wafer, the mechanical strength is extremely lowered as compared with the case where porous layers of the same thickness are formed under constant anodizing conditions. That is, the number of times of use of the shield wafer is further more restricted.

However, according to the present embodiment, since the porosities of the two or more porous layers of the substrate 1 is determined by the structure of the single-crystal semiconductor layer epitaxially grown on the surface of the substrate, it is possible to effect anodization while keeping constant the HF concentration, current density, and the like. Thus, the peeling off of the porous member from the shield wafer is prevented, so that the service life of the shield wafer can be prolonged. Therefore, as the anodizing solution, an HF solution of a constant concentration may be provided and supplied into the chamber 100 from a solution supply means (not shown). Further, the power source 104 may be a constant current source.

The thickness of the high porosity layer 13 is equal to or less than that of the low impurity concentration layer 22. Thus, the thickness t4 of the single-crystal semiconductor layer 11 and the thickness t2 of the porous layer 2 satisfy t4≧t2.

The number of the porous layers constituting the porous layer structure may be three or more if needed. Especially, when another low porosity layer is additionally formed under the high porosity layer as the second layer from the surface, even if a defect is generated during the separation, the defect is mostly holden within the porous layer, so as the defect can be removed in the subsequent step of removing the porous layer. Thus, the defect will not remain in the substrate to be reclaimed.

Thus, when the porous layer structure of three or more porous layers is formed there are formed in the epitaxially grown single-crystal semiconductor layer three or more layers which differ from one another in at least one of composition, impurity concentration, impurity species, or the like so as to match with the porous layers.

As described above, preliminary changing any condition of the resistivity, conductivity type and composition of the portion to be made porous makes it possible to change the porosity. For example, under the same anodizing conditions, a non-degenerate substrate (P⁻) provides a pore density which is larger by one order than that of a degenerate substrate (P⁺) to have a higher porosity, although being decreased in the pore diameter. That is, the porosity can be controlled by varying the conditions during the epitaxial growth.

The thickness of the low porosity layer 12 formed on the surface side is defined by the thickness of the single-crystal semiconductor layer preliminary formed on the surface side. The structure of the porous layer is influenced by the composition of the anodizing solution and the current density as well as the composition and resistivity of the single-crystal semiconductor layer. It is desirable to set the conditions such that the porosity of the layer 12 is preferably about 40% or less, and more preferably 25% or less.

Further, when tow or more single-crystal semiconductor layers are formed, the thickness of the low porosity layer 12 formed on the surface side is preferably 20 μm or less, more preferably 5 μm or less, and most preferably 2 μm or less. The lower limit of the thickness of the layer 12 is determined depending on whether the crystallinity of the non-porous single-crystal layer formed after formation of the porous member is affected or not, but is about 100 nm or more.

The porosity of the high porosity layer 13 which provides a portion for occurrence of a crack, i.e., a separation interface is preferably not less than 25% and not more than 60%, and more preferably not less than 40% and not more than 60%.

The thickness of the high porosity layer 13 is preferably 20 μm or less, more preferably 1 μm or less, and most preferably 0.5 μm or less, with the lower limit of the thickness being 10 nm.

It is also preferable that the thickness of the high porosity layer 13 is smaller than that of the low porosity layer 12.

In order to control the porosity, the amount of an impurity incorporated into the single-crystal semiconductor layer formerly formed to design the resistivity as follows.

When the resistivity of the layer to form the low porosity layer is defined as ρ1 and the resistivity of the layer to form the high porosity layer is defined as ρ2, it is designed that the relationship ρ1<ρ2 is attained. Further, it is designed that ρ1 satisfies 0.001 Ω cm<ρ1≦0.1 Ω cm or 0.005 Ω cm<ρ1≦0.02 Ω cm, and that ρ2 satisfies 0.02 Ω cm<ρ2≦10000 Ω cm or 0.1 Ω cm<ρ2≦100 Ω cm.

It is preferable that when effecting the epitaxial growth, the layers 21 and 22 are formed with addition of a dopant compound such as $PH_3$ or $B_2H_6$ in such an amount as to attain the above mentioned resistivities.

A plurality of separable porous layers is described in, for example, K. Sakaguchi et al., Electrochemical Society Proceedings, Vol. 99-3, pp. 117–121.

Figure 1C:
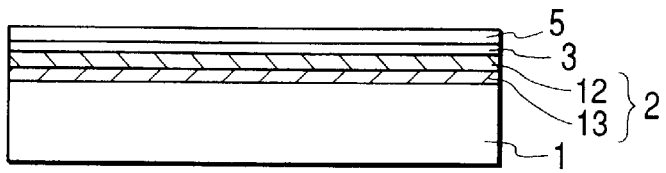

Next, as shown in FIG. 1C, the a non-porous single-crystal layer 3 is formed on the porous layer 2. Further, an insulating layer 5 is formed on the surface of the non-porous single-crystal layer 3 as the occasion demands.

[Non-Porous Single-Crystal Layer]

Since the porous layer is generally formed by etching a single-crystal substrate using an electrolytic etching effect typically as in the anodization method, the single-crystallinity of the pore walls is maintained, so that it is possible to epitaxially grow the non-porous single-crystal layer 3 on the porous layer. In order to avoid that the internal pores are rearranged to impair the characteristics of the subsequent accelerated etching step of the porous layer, it is preferable to effect the epitaxial growth at a temperature less than 1000° C. if a protective film such as silicon oxide is preliminarily formed on the pore walls of the porous layer by means of oxidation or the like, high temperature growth at 1000° C. or more is possible.

The epitaxial growth method includes preferably thermal CVD, molecular beam epitaxial growth, plasma CVD, low pressure CVD, photo CVD, bias sputtering, liquid phase growth, and so on.

In the present embodiment, by forming at least two porous layers and arranging a porous layer of a low porosity as the surface, it is possible to significantly improve the crystallinity and surface smoothness of the non-porous single-crystal layer formed on the porous layer, especially an epitaxial Si film. The thus improved crystallinity greatly contributes the improvement of the yield as well as the characteristics of an electronic device formed using the semiconductor member.

For example, when crystal defects are present in $1\times10^5$/ $cm^2$ in an epitaxial Si layer on a porous layer with 50% porosity, the crystal defect density of an epitaxial Si layer on a porous layer with 20% porosity grown under the same growth conditions is $5\times10^3/cm^2$, which provides a difference of the order of 1.5. Further, when the surface roughnesses are evaluated through an atomic force microscope, it is found that the root-mean-squares of surface roughness (Rrms) in a 50 μm square area are 1.2 nm and 0.3 nm, respectively, which are quite different from each other. A large surface roughness brings about disadvantages in the bonding step.

Figure 1D:
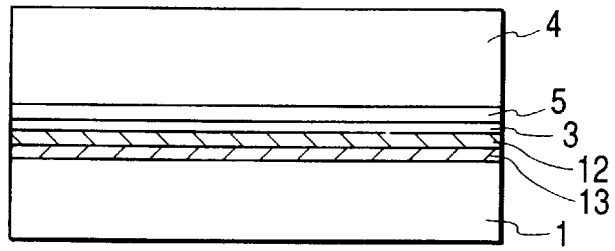

Then, as shown in FIG. 1D, the substrate 1 and the support substrate 4 are bonded to each other to provide a multi-layer structure of which the non-porous single-crystal layer 3 is positioned inside.

[Bonding]

The single-crystal substrate having the non-porous single-crystal layer formed on the surface of the porous layer and the support substrate are bonded to each other. Further, a layer such as an insulating layer may be formed on at least one of the non-porous single-crystal layer surface and the support substrate surface, prior to the bonding.

For example, when silicon wafers are used as the support substrate and the single-crystal substrate, silicon is used for the non-porous single-crystal layer, a silicon oxide layer is formed on the non-porous single-crystal layer surface or the support substrate surface, and then bonding is effected, it is possible to make an SOI wafer with the SOI structure.

The support substrate may be not only a silicon wafer but also a light transmissive substrate such as a quartz wafer, a substrate formed of polycrystal silicon formed by the casting method, a high melting glass substrate, etc. or a compound semiconductor substrate such as a GaAs substrate. It is preferable for bonding that the surface thereof is a smooth, flat, specular surface.

It is preferred that the bonding is carried out in a clean room from which contaminant, dust and the like are removed. If contaminant, dust and the like deposit on a portion of the bonding surface, even if they are very fine, the portion may form unbonded region.

The bonding surfaces of the single-crystal substrate and the support substrate are subjected to a common cleaning step such as used in the semiconductor process to remove deposited dust, organic matter, metallic contaminant and so on, and then carefully brought into close contact with each other and bonded. Further, if necessary, a heat treatment may be employed to increase the bonding strength.

Figure 1E:
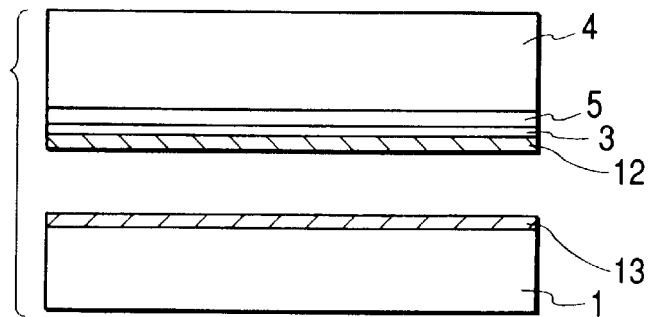

Then, as shown in FIG. 1E, the single-crystal substrate 1 and the support substrate 4 as bonded (multi-layer structure) is separated at the interface of the high porosity layer 13 and the low porosity layer 12. Depending the structure of the porous layer 2, a crack may be generated inside the high porosity layer 13, or a crack may be generated at an upper or lower interface of the layer 13.

[Separation at Porous Layer]

The mechanical strength of porous Si depends on its porosity but is considered to be smaller than that of bulk Si. For example, the mechanical strength of porous Si with 50% porosity may be considered to be a half of that of bulk Si. That is, when a compressive, pulling or shearing force is applied to the bonded wafer, the porous Si layer is firstly destroyed. Further, increasing the porosity makes it possible to destroy the porous layer by a smaller force. Further, a solid wedge such as a blade or a fluid wedge such as water jet, etc. may be inserted into the side surface of the bonded substrate.

The separation methods are described in detail with reference to FIGS. 3A to 3D.

Figure 3A:
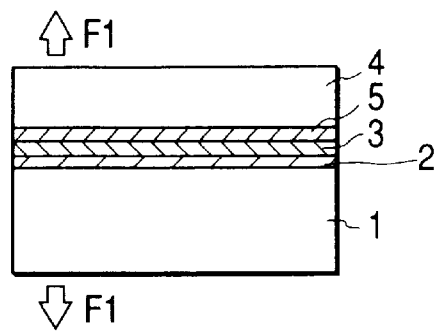
FIGS. 3A, 3B, 3C and 3D are schematic views illustrating separation methods used in the present invention.

The method of pulling the substrate in a direction crossing the bonding surface may be a method of applying an external force F1 to an end portion of the substrate to effect separation as shown in FIG. 3A. In this case, a crack proceeds from the end portion to the inside of the substrate.

Figure 3B:
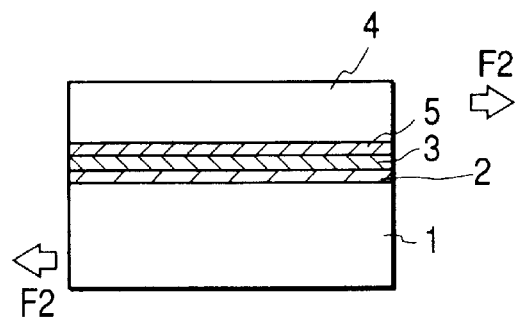

Further, the method of applying a shearing force (stress) to the substrate in a direction parallel to the bonding surface, specifically a method of moving the respective substrates in opposite directions parallel to the bonding surface or a method of rotating the respective substrates in opposite circumferential directions applies an external force F2 as shown in FIG. 3B.

Further, the method of applying a pressure to the substrate in a direction crossing the bonding surface is to be understood as applying an external force in a direction opposite to the direction of the external force F1 as shown in FIG. 3A.

In the above mentioned methods, application of a force may be effected by attaching a jig to the bonded substrate and applying the force to the jig.

Figure 3C:
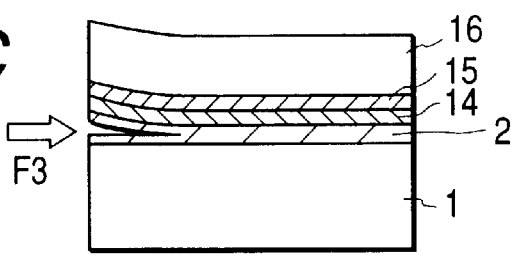

Further, the method may be used in which an energy F3 for peeling off is applied to an end surface of the substrate as shown in FIG. 3C. Specifically, it is possible to insert a sharp blade into the end surface or to jet a pressurized fluid through a nozzle to the end surface, thus causing peeling off at the end surface. Further, it is possible to thermally oxidize the end portion of the substrate to effect volume expansion of the porous layer 2 to thereby effect peeling off at the end surface. In addition, it is also possible to sue a flexible substrate as the support substrate 4 and to pull the flexible substrate so as to be warped, thus causing peeling off at the end surface.

The separation methods that can be used in the present invention are described in detail in U.S. Pat. Nos. 5,856,229 and 5,854,123 and Japanese Patent Application Laid-Open Nos. 9-237884, 10-233352 and 11-45840.

Further, a method may be adopted in which the porous layer having a function of a separation region is selectively etched from the side surface of the bonded substrate to effect separation.

Figure 3D:
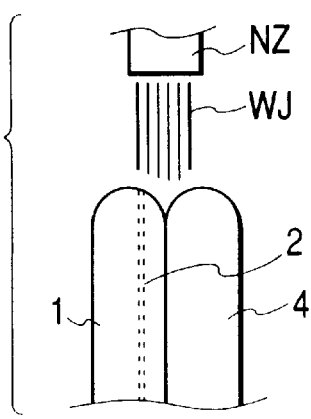

FIG. 3D illustrates a method in which a liquid such as water, pure water, etc. or a gas fluid such as nitrogen, air, oxygen, hydrogen, carbon dioxide gas, an inert gas, etc. is jetted to an end portion of the bonded substrate. In the figure, NZ denotes a fluid jetting nozzle and WJ denotes a fluid, and the fluid WJ is jetted to a recessed portion formed between the chamfered substrates 1 and 4 to effect separation into two.

The remaining porous layer is preferably removed by etching. The porous layer has a large number of fine voids formed therein and has a significantly increased surface area relative to the volume. Further, the silicon is present only as extremely thin walls. Therefore, in co-operation with penetration of an etching liquid by the capillary phenomenon, the chemical etch rate of the porous layer is remarkably accelerated as compared with that of ordinary single-crystal layer.

The selective etching of the porous silicon layer with regard to non-porous silicon is carried out by, for example, an aqueous mixed solution of hydrofluoric acid and hydrogen peroxide. During etching, a surfactant such as alcohol, etc. may be added to remove bubbles depositing the etching surface as the occasion demands. Further, for removing the porous layer, anther technique such as polishing or the like may be used.

Further, the following steps may be additionally carried out.

When the surface smoothness of the substrate 1 and the support substrate 4 after removal of the porous layer is not sufficient, smoothing of the surface is carried out. The smoothing is effected by, for example, a heat treatment in a reducing atmosphere comprising hydrogen. This heat treatment smoothes, for example, a surface with the root-mean-square of surface roughness (Rrms) of 10 nm as observed by an atomic force microscope to that of a commercially available silicon wafer.

Further, the reduction rate of the film thickness by this smoothing treatment is, e.g., 0.08 nm/min, and the reduction for one hour treatment is at most 4.8 nm. This is less than 1/100,000 of the thickness of an ordinary silicon wafer 500–700 $\mu$m and is negligible. Incidentally, the smoothing may be effected by another method than the hydrogen annealing such as polishing, etching, or the like.

Further, instead of subjecting the substrate 1 to smoothing treatment, it is possible to put the substrate again into the step of forming a single-crystal semiconductor layer thereon by epitaxial growth. The present inventors have found that during an epitaxial growth step, the surface smoothness is improved with the epitaxial growth.

The effect of improving surface smoothness is remarkable in epitaxial growth by the CVD method. With epitaxial growth, a film thickness of preferably 1 $\mu$m or more, more preferably 3 $\mu$m or more provides a flat and smooth surface suitable for the bonding.

Next, another preferred embodiment of the present invention is described with reference to FIGS. 4A to 4E.

Figure 4A:
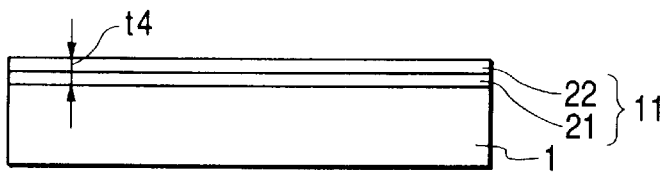
FIGS. 4A, 4B, 4C, 4D and 4E are schematic sectional views illustrating the steps of another example of the process of producing a semiconductor article in accordance with the present invention.

As shown in FIG. 4A, a single-crystal substrate 1 is provided, and a non-porous single-crystal semiconductor layer 11 having a thickness of t4 is formed thereon by the epitaxial growth. Here, the single-crystal semiconductor layer 11 comprises a plurality of layers 21 and 22 which have been made different from each other in the kind and/or concentration of an introduced impurity by means such as changing the epitaxial growth conditions during the growth.

Here, unlike the case of FIG. 1A, the low impurity concentration layer 22 is provided on the surface side.

When a porous layer with a high porosity is to be formed on the surface side, a low impurity concentration layer is formed in a small thickness on the surface side and a high impurity concentration layer is formed thereunder. In this case, it is preferably that the low impurity concentration layer formed on the surface side is thinner that the high impurity concentration layer formed thereunder.

For example, the low impurity concentration layer 22 may be formed on the surface side by forming the single-crystal semiconductor layer 11 with a uniform impurity concentration and diffusing out the impurity existing on the surface side by a heat treatment.

Alternatively, it is also preferable that a layer as the single-crystal semiconductor layer 11 with a uniform impurity concentration is formed and a porous layer with a high porosity is formed by a subsequent process on the surface side.

Figure 4B:
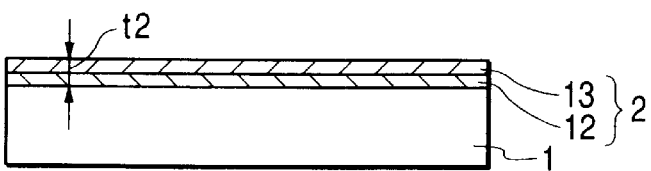

Next, as shown in FIG. 4B, a porous layer 2 is formed.

When a low impurity concentration layer is formed on the surface side and a high impurity concentration layer is formed thereunder, a high porosity layer may be formed on the surface side by the anodization process.

A porous layer with a high porosity may also be formed on the surface side by anodizing a single-crystal semiconductor layer with a uniform impurity concentration to form a porous layer and then making thinner the walls of the surface side pores of the porous layer to increase the porosity at the surface side of the porous layer.

Thus, the high porosity layer 13 is provided on the surface side.

Further, another layer with a moderate porosity may be formed between the surface-side high porosity layer 13 and the underlying low porosity layer 12.

This layer may be a porosity-varied layer in which the porosity gradually varies in the layer thickness direction.

Figure 4C:
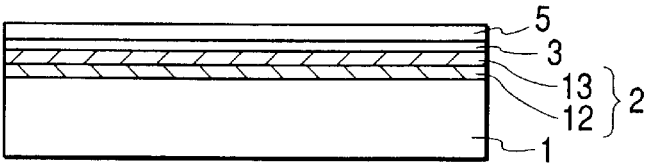
Figure 4D:
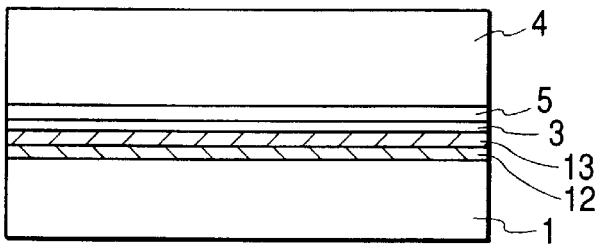

Next, as shown in FIG. 4C, the a non-porous single-crystal layer 3 is formed on the porous layer 2. Further, an insulating layer 5 is formed on the surface of the non-porous single-crystal layer 3 as the occasion demands.

Then, as shown in FIG. 4C, the substrate 1 and the support substrate 4 are bonded to each other to provide a multi-layer structure of which the non-porous single-crystal layer 3 is positioned inside.

Figure 4E:
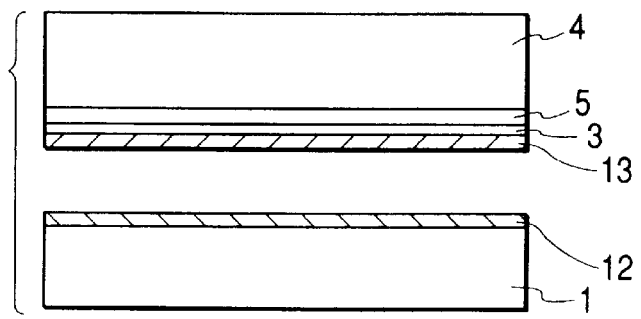

Then, as shown in FIG. 4E, the single-crystal substrate 1 and the support substrate 4 as bonded (multi-layer structure) is separated at the interface of the high porosity layer 13 and the low porosity layer 12. Depending the structure of the porous layer 2, a crack may be generated inside the high porosity layer 13, or a crack may be generated at an upper or lower interface of the layer 13.

In the present embodiment in which the porous layer in contact with the non-porous single-crystal layer 3 is the high porosity layer 13 and the porous layer lying thereunder is the low porosity layer 12, since the porous layer remaining on the surface of the non-porous single-crystal layer 3 is highly porous, specifically since the pore walls of the remaining porous member is thin, the removal thereof is rendered easier.

Further, since the roughness of the surface of the non-porous single-crystal layer after the removal of the remaining porous member is smaller, it is possible to shorten the time required for smoothing by the hydrogen annealing or to lower the temperature required for the hydrogen annealing.

This, the steps subsequent to the separation are simplified, so that the throughput is increased and the production cost is reduced.

EXAMPLES

The present invention will be clarified further by examples thereof, but it is to be understood that the present invention is by no means limited by these examples.

Example 1

The process of producing a semiconductor substrate of the present example is described with reference to FIGS. 5A to 5I.

Figure 5A:
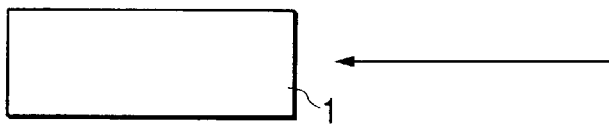
FIGS. 5A, 5B, 5C, 5D, 5E, 5F, 5G, 5H and 5I are schematic sectional views illustrating the steps of still another example of the process of producing a semiconductor article in accordance with the present invention.

As shown in FIG. 5A, a first substrate 1 made of a p-type single-crystal silicon wafer was provided as the single-crystal substrate.

Figure 5B:
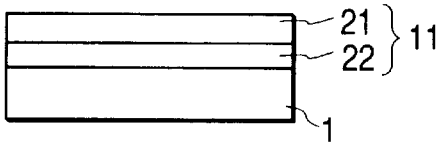
Figure 5C:
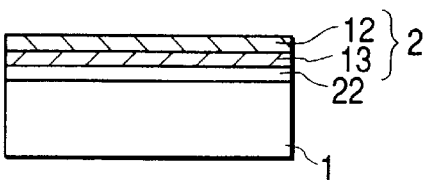

Epitaxial growth was carried out with addition of diborane ($B_2H_6$) by the CVD method. During the growth, by reducing the addition amount of diborane, a low impurity concentration layer 22 made of $p^+$-type single-crystal silicone of 0.5 Ω cm in resistivity and 1 μm in thickness was formed, and a high impurity concentration layer 21 made of $p^{++}$-type single crystal silicon of 0.015 Ω cm in resistivity and 2 μm in thickness was formed thereon, which provided an epitaxial growth layer 11 having a thickness of about 3 μm as the single-crystal semiconductor layer, as shown in FIG. 5B.

The epitaxial growth layer 11 was anodized in an mixed solution of HF and ethanol under the following anodization conditions.

Current Density: 7 ($mA/cm^2$)

Anodizing Solution: $HF:H_2O:C_2H_5OH=1:1:1$

Time: 4 min

The anodization formed a low porosity layer 12 made of porous silicon with about 20% porosity in a region extending from the outermost surface to a depth of 2 μm, and further formed thereunder a structurally fragile, high porosity layer 13 with about 50% porosity in a region extending from the surface of the low impurity concentration layer 22 to a depth of 0.5 μm. Thus, there was obtained a porous region 2 consisting of the plurality of layers having different porosities. This state can be confirmed by sectional observation with a high resolution scanning electron microscope.

After the thus obtained first substrate was treated for 1 hour at 400° C. in oxygen atmosphere to form a silicon oxide film on the walls inside the pores of the porous region 2, the very thin silicon oxide film formed on the layer surface was removed by dipping into an 1.25 wt. % aqueous solution of HF for 30 seconds.

Then, the first substrate was put in an epitaxial growth apparatus, and a single-crystal Si layer 3 as the non-porous single-crystal layer was epitaxially grown in a thickness of 0.03 μm by the CVD method under the following growth conditions.

Source Gas: $SiH_2Cl_2/H_2$

Gas Flow Rate: 0.2/180 l/min

Gas Pressure: 760 Torr (ca. $1 \times 10^5$ Pa)

Temperature: 1060° C.

Growth Rate: 0.15 μm/min

Figure 5D:
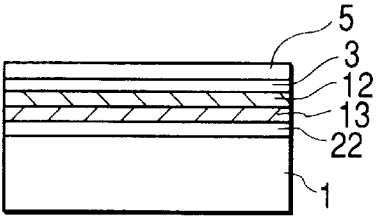

Then, on the surface of the single-crystal Si layer 3, an insulating layer made of an $SiO_2$ layer of a thickness of 200 nm was formed by thermal oxidation (FIG. 5D).

Figure 5E:
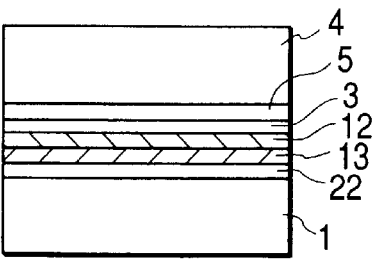

A surface of a second substrate (support substrate) made of a separately prepared Si wafer and the surface of the insulating layer 5 are superposed upon each other and brought into contact with each other, which was followed by annealing at 1180° C. for 5 minutes. Thus, as shown in FIG. 5E, there was obtained a bonded substrate (multi-layer structure) as firmly bonded.

Figure 5F:
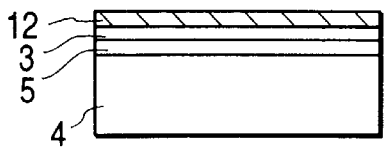
Figure 5H:
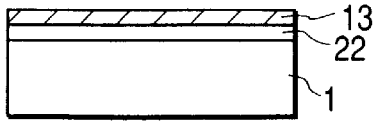

Separating the bonded substrate by jetting a fluid to the side surface thereof resulted in division in the vicinity of the upper interface within the high porosity layer 13 (see FIGS. 5F and 5H). As the separation methods other than mentioned above, there can be used application of external force such as pressurizing, pulling, shearing, wedge insertion, etc., optical energy application, ultrasonic wave application, heat application, oxidation accompanied by circumferential expansion of the high porosity layer 13 and internal pressure application to the high porosity layer 13, pulse-wise heating, thermal stress application, softening, or the like.

Subsequently, when the support substrate 4 was dipped in a mixture solution of HF and hydrogen peroxide, the low porosity layer 12 remaining on the surface was removed in about 60 minutes. Then, for surface smoothing of the layer 3, a heat treatment at 1100° C. for 4 hours was carried out in hydrogen atmosphere. The surface roughness, evaluated by an atomic force microscope, was about 0.2 nm in terms of the mean square roughness in an area of 50 $\mu$m square, which was comparable to that of a commercially available, secularly polished Si wafer. Further, the crystal defect density was measured to show stacking fault density of 50/cm$^2$.

Figure 5G:
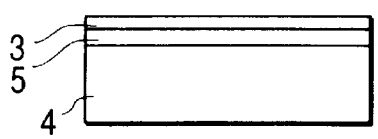
Figure 5I:

Thus, as shown in FIG. 5G, there was obtained an SOI wafer having the single-crystal Si layer 3 of a small defect density on the insulating layer 5. The insulating layer 5 does not necessarily need to be formed only on the surface of the single-crystal layer 3 but also may be formed only on the surface of the support substrate 4 or on the surfaces of both the first substrate 1 and the support substrate 4.

On the other hand, when the high porosity layer 13 remaining on the first substrate 1 was dipped in a mixture solution of HF and hydrogen peroxide, it was removed in about 30 minutes. Then, the layer 22 was removed by polishing and the surface was smoothed. When the thus obtained substrate was again put into the step shown in FIG. 5A as the p-type single-crystal Si substrate 1 for producing a second SOI wafer, there could be produced a second SOI wafer having similar quality.

When the above described steps was repeated and the p-type single-crystal Si substrate 1 was reutilized ten times, it was possible to carry out the steps as with the case of the original p-type single-crystal Si substrate 1 for each time of reutilization and to obtain 11 SOI wafers in total from 12 silicon wafers.

Example 2

FIGS. 6A to 6L are schematic sectional views showing the steps of the process of producing a semiconductor substrate of the present example.

Figure 6A:
FIGS. 6A, 6B, 6C, 6D, 6E, 6F, 6G, 6H, 6I, 6J, 6K and 6L are schematic sectional views illustrating the steps of yet another example of the process of producing a semiconductor article in accordance with the present invention.
Figure 6B:
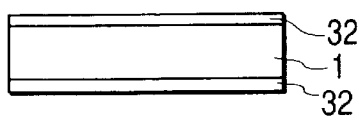

As shown in FIG. 6A, a plurality of p-type (100) Si wafers of a dummy grade with a resistivity range of 1–100 $\Omega$ cm made by the CZ method ware prepared as the single-crystal substrate 1. Of the wafers, one analyzed in one step was not subjected to the subsequent step and only those which were not analyzed were subjected to the subsequent step.

The wafers were placed in a vertical diffusion furnace, and BBr$_3$ gas diluted with nitrogen was introduced into the furnace. In the furnace, the BBr$_3$ gas and oxygen were mixed to form a B$_2$O$_3$—SiO$_2$ film (not shown) on the whole of the front and back surfaces of the wafers. Next, a heat treatment at 1000° C. for 30 minutes was carried out to diffuse boron into the wafers, and the wafers were then put out from the furnace.

the wafers were dipped in an HF solution for 10 minutes to peel off the B$_2$O$_3$—SiO$_2$film and then fully cleaned with water and dried. When the wafers were measured by the SR method, it was observed that a diffused layer 32 with a high p-type carrier concentration of $5 \times 10^{18}$/cm$^3$ or more was formed on the front and back surfaces of the wafers.

Figure 6C:
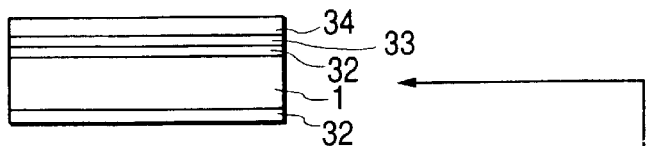

On each of the wafers was formed an epitaxial silicon layer of 5 $\mu$m thickness as the single-crystal semiconductor layer by the CVD method with addition of diborance (FIG. 6C). By changing the concentration of diborane as a dopant to higher one during the growth, a p$^{++}$-type Si layer 34 of 0.015 $\Omega$ cm in resistivity was formed from the outermost surface to a depth of 4 $\mu$m, and a p$^-$-type Si layer 33 of 2 $\Omega$ cm in resistivity was formed thereunder in a depth of 2.5 $\mu$m.

Then, the wafers were set in an mixed solution of HF and ethanol such that the epitaxial growth layers 33, 34 formed side of the wafers formed an anode and the epitaxial growth layers 33, 34 were made porous by anodization under the following anodization conditions.

Figure 6D:
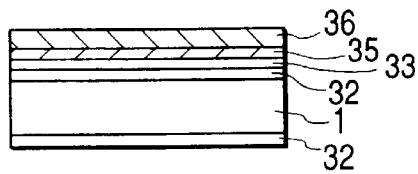

Current Density: 7 (mA/cm$^2$)
Anodizing Solution: HF:H$_2$O:C$_2$H$_5$OH=1:1:1
Time: 10 min After the anodization, when sectional observation was carried out with a high resolution scanning electron microscope, it was confirmed that there was formed a low porosity layer 36 with about 20% porosity in a region extending from the outermost surface to a depth of 4 $\mu$m, and there was formed thereunder a structurally fragile, high porosity layer 35 with about 50% porosity in a thickness of 0.5 $\mu$m (FIG. 6D). The porosities were determined by electron microscopic photographs. Then, the wafers were treated for 2 hours at 300° C. in oxygen atmosphere.

Subsequently, the wafers were dipped into an 1.25 wt. % aqueous solution of HF for 30 seconds, pulled up from the solution and rinsed with pure water for 10 minutes. When the distribution in the depth direction of the oxygen concentration of the porous layer was measured by the secondary ion mass spectroscopy (SIMS), it was confirmed that the oxygen concentration of a region from the surface to 2 $\mu$m depth of the porous silicon layer was about one half of that of a layer deeper than the region.

Then, the wafers were put in a piece to piece type epitaxial growth apparatus and subjected to hydrogen pre-baking, pre-injection, inter-baking, and epitaxial growth by the CVD method in this order to epitaxially grow a single-crystal Si layer as the non-porous single-crystal layer 3 in a thickness of 0.26 $\mu$m under the following conditions.

(Hydrogen Pre-baking)
    Gas: H$_2$
    Gas Flow Rate: 43 l/min
    Temperature: 950° C.
    Pressure: 600 Torr (ca. 8.0×10$^4$ Pa)
    Time: 60 sec
(Pre-injection)
    Source Gas: SiH$_4$/H$_2$
    Gas Flow Rate: 0.015/43 l/min
    Gas Pressure: 600 Torr (ca. 8.0×10$^4$ Pa)
    Temperature: 950° C.
    Time: 200 sec
(Inter-baking)
    Gas: H$_2$
    Gas Flow Rate: 43 l/min
    Pressure: 600 Torr (ca. 8.0×10$^4$ Pa)
    Temperature: 1100° C.
    Time: 30 sec
(Epitaxial Growth)
    Source Gas: SiH$_2$Cl$_2$/H$_2$
    Gas Flow Rate: 0.15/43 l/min
    Gas Pressure: 80 Torr (ca. 1.1×10$^4$ Pa)
    Temperature: 900° C.
    Growth Rate: 0.2 $\mu$m/min When a substrate with the thickness of the epitaxial layer 3 of 2 μm was formed in the above described manner, subjected to the Seco etching, and observed with differential interference mode of an optical microscope to observe etch pits corresponding to stacking faults in a density of 50 cm$^{-2}$.

Figure 6E:
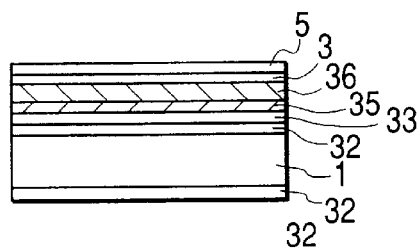
Figure 6F:
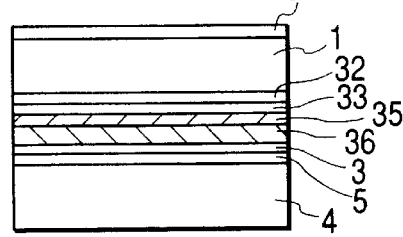

Then, on the surface of the epitaxial Si layer 3, an insulating layer 5 made of an SiO$_2$ layer of a thickness of 50 nm was formed by thermal oxidation at 800° C. (FIG. 6E). A surface of a separately prepared support substrate 4 made of a quartz substrate and the surface of the insulating layer 5 are exposed to a nitrogen plasma, cleaned with water, dried, superposed upon each other, and bonded to each other (FIG. 6F).

Figure 6G:
Figure 6H:
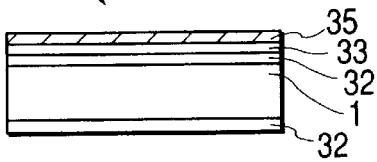

Separating the thus obtained bonded substrate resulted in division in the high porosity layer 35 (FIGS. 6G and 6H). As the separation methods, there can be used application of external force such as pressurizing, pulling, shearing, wedge insertion, etc., optical energy application, ultrasonic wave application, heat application, oxidation accompanied by circumferential expansion of the high porosity layer 35 and internal pressure application to the high porosity layer 35, pulse-wise heating, thermal stress application, softening, jetting water flow to the side surface of the bonded substrate, or the like.

Figure 6I:
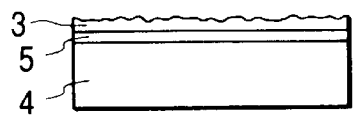

A heat treatment was effected at 400° C. for one hour in nitrogen atmosphere to increase the bonding strength. Subsequently, when the support substrate 4 was dipped in a mixture solution of HF and hydrogen peroxide, the porous layers 35, 36 remaining on the surface was removed in about 60 minutes to form an SOI wafer (FIG. 6I). Then, the surface of the non-porous single-crystal layer 3 was dipped in a depth of about 50 nm into an aqueous solution of ammonia and hydrogen peroxide to remove a surface layer having a boron concentration made high by boron diffusion from the porous layer.

Further, the single-crystal layer 3 was placed in hydrogen atmosphere and subjected to a heat treatment at 940° C. for 4 hours. The surface roughness of the layer 3, evaluated by an atomic force microscope, was 0.2 nm in terms of the mean square roughness in an area of 50 μm square, which was comparable to that of a commercially available Si wafer. Further, the crystal defect density was measured to show stacking fault density of 45/cm$^2$. Thus, there was formed a single-crystal Si layer 3 with a small defect density on the insulating layer 5 (FIG. 6J).

Figure 6K:
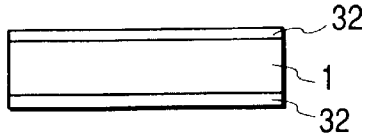
Figure 6J:
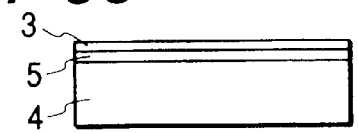
Figure 6L:
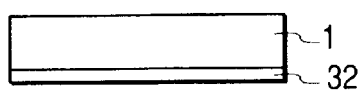

The porous silicon layer 35 and the p$^-$-type Si layer 33 remaining on the single-crystal substrate 1 were dipped in a mixture solution of HF, nitric acid and acetic acid, they were removed in about 30 minutes (FIG. 6K). Then, the surface of the diffused layer 32 on the first substrate 1 after the etching was polished in about 2 μm and smoothed (FIG. 6I). When the thus obtained substrate was again put into the step shown in FIG. 6C, there could be produced a second SOI wafer having the same quality as that of the firstly obtained SOI wafer.

When the Si substrate 1 was reutilized ten times, it was possible to carry out the steps as with the case of the original Si substrate 1 for each time of reutilization and to obtain 11 SOI wafers in total from 12 silicon wafers.

Example 3

FIGS. 7A to 7I are schematic sectional views showing the steps of the process of producing a semiconductor substrate of the present example.

Figure 7A:
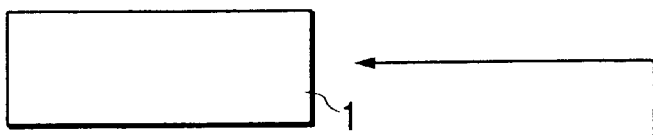
FIGS. 7A, 7B, 7C, 7D, 7E, 7F, 7G, 7H and 7I are schematic sectional views illustrating the steps of again, another example of the process of producing a semiconductor article in accordance with the present invention.

As shown in FIG. 7A, a plurality of boron-doped p-type (100) 6-inch Si wafers with a resistivity range of 0.01–0.02 Ω cm made by the CZ method ware prepared as the single-crystal substrate 1. Of the wafers, one analyzed in one step was not subjected to the subsequent step and only those which were not analyzed were subjected to the subsequent step.

Figure 7B:
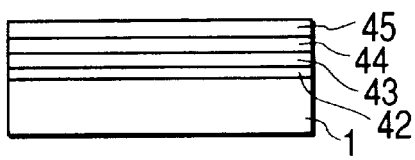

On each of the wafers was epitaxially grown a single-crystal semiconductor layer of 5 μm in thickness by the CVD method with addition of phosphine (FIG. 7B). By changing the concentration of phosphine as a dopant during the growth, an n$^{++}$-type Si layer 45 of 0.01 Ω cm in resistivity was formed from the outermost surface to a depth of 3 μm, an n$^-$-type Si layer 44 of 2 Ω cm in resistivity was formed thereunder in a depth of 1 μm, an n$^{++}$-type Si layer 43 of 0.01 Ω cm in resistivity was formed thereunder in a depth of 0.5 μm, and the epitaxial silicon layer 42 lying undermost was 0.5 μm in thickness. Measurement in this state provided a total thickness of 627 μm.

Then, the wafers were set in a mixed solution of hydrofluoric acid and ethanol such that the single-crystal semiconductor layer formed side of the wafers formed an anode and the single-crystal semiconductor layer side was made porous by anodization under the following anodization conditions under irradiation with a light.

Figure 7C:
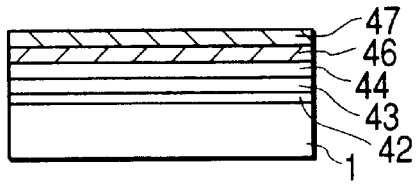

Current Density: 7 (mA/cm$^2$)
Anodizing Solution: HF:H$_2$O:C$_2$H$_5$OH=1:1:1
Time: 5 min After the anodization, when sectional observation was carried out with a high resolution scanning electron microscope, it was confirmed that there was formed a low porosity layer 47 with about 25% porosity in a region extending from the outermost surface to a depth of 3 μm, and there was formed thereunder a structurally fragile, high porosity layer 46 with about 50% porosity in a thickness of 0.5 μm (FIG. 7C). The porosities were determined by electron microscopic photographs. Then, the wafers were treated for 1 hour at 400° C. in oxygen atmosphere.

Subsequently, the wafers were dipped into a 1.25 wt. % aqueous solution of HF for 20 seconds, pulled up from the solution and rinsed with pure water for 10 minutes. The wafers were put in an epitaxial growth apparatus and subjected to the following processes and epitaxial growth by the CVD method in the order mentioned below to epitaxially grow a single-crystal Si layer as the non-porous single-crystal layer 3 in a thickness of 1.35 μm under the following conditions.

(Hydrogen Pre-baking)
　Gas: H$_2$
　Gas Flow Rate: 43 l/min
　Temperature: 950° C.
　Time: 30 sec
(Pre-injection)
　Source Gas: SiH$_4$/H$_2$
　Gas Flow Rate: 0.03/43 l/min
　Temperature: 950° C.
　Time: 100 sec
(Epitaxial Growth)
　Source Gas: SiH$_2$Cl$_2$/H$_2$
　Gas Flow Rate: 0.15/43 l/min
　Temperature: 900° C.
　Growth Rate: 0.3 μm/min When a substrate with the thickness of the single-crystal Si layer of 2 μm was formed in the above described manner, subjected to the Seco etching, and observed with differential interference mode of an optical microscope to observe etch pits corresponding to stacking faults in a density of 200 cm$^{-2}$.

Figure 7D:
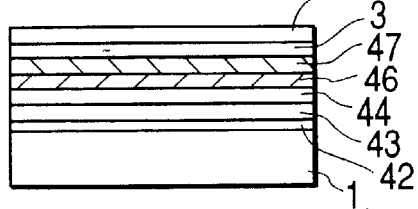
Figure 7E:
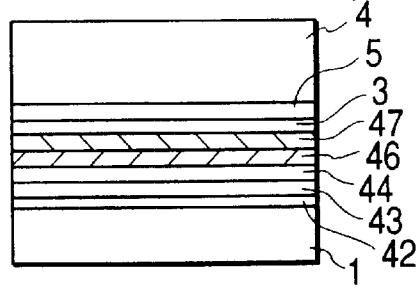

Then, on the surface of the single-crystal Si layer, an insulating layer 5 made of an $SiO_2$ layer of a thickness of 500 nm was formed by thermal oxidation (FIG. 7D). A surface of a separately prepared p-type (100) silicon substrate (support substrate) 4 with a resistivity of 8–12 Ωcm and the surface of the insulating layer 5 are subjected to chemical cleaning used in ordinary silicon device production processes, cleaned with water, dried superposed upon each other, and bonded to each other. Then, a heat treatment was effected at 1100° C. for one hour (FIG. 7E).

Figure 7F:
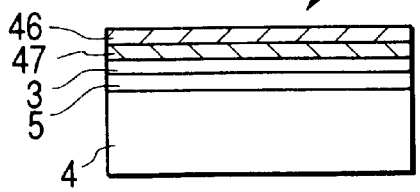
Figure 7H:
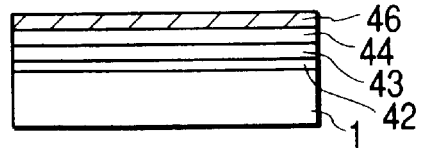

When the bonded substrate was rotated while holding the center portion and nitrogen was jetted to its side surface in this state, a crack was generated in the high porosity layer 46 and the bonded wafer could finally be separated into tow members (FIGS. 7F and 7H).

Figure 7G:
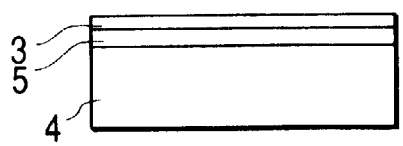
Figure 7I:

Subsequently, when the support substrate 4 was dipped in a mixture solution of HF and hydrogen peroxide, the porous silicon layers 46, 47 remaining on the surface was removed in about 90 minutes to form an SOI wafer (FIG. 7G). Further, the wafer was subjected to a heat treatment at 1100° C. for 1 hour in hydrogen atmosphere.

The surface roughness evaluated by an atomic force microscope was 0.2 nm in terms of the mean square roughness in an area of 50 μm square, which was comparable to that of a commercially available Si wafer. Further, the crystal defect density was measured to show stacking fault density of 180/cm². Thus, there was obtained an SOI wafer having the single-crystal Si layer with a small defect density formed on the insulating layer 5.

The porous silicon layer 46, n⁻-type Si layer 44, N⁺⁺-type Si layer 43 and epitaxial silicon layer 42 remaining on the p-type single-crystal Si substrate 1 were removed by polishing. When the thus obtained substrate was again put into the step shown in FIG. 7A as the p-type single-crystal Si substrate 1, there could be produced a second SOI wafer having the same quality as that of the firstly obtained SOI wafer.

When the surface of the p-type single crystal Si substrate 1 after the removal of the porous silicon layer 46 was measured by an atomic force microscope, the surface roughness was as large as 10 nm in terms of the mean square roughness in an area of 1 μm square. On the other hand, the surface roughness before the anodization was 0.17 nm, which showed a reduction to 1/50 or less. Further, the thickness of the reclaimed substrate was not substantially changed from that of the original substrate and was 626.5 μm. Further, carrying out the subsequent steps such as anodization, epitaxial growth, bonding, and so on could produced an SOI wafer again.

When the p-type single-crystal Si substrate 1 was reutilized ten times, it was possible to carry out the steps as with the case of the original p-type single-crystal Si substrate 1 for each time of reutilization and to obtain 11 SOI wafers in total from 12 silicon wafers.

Example 4

FIGS. 8A to 8K are schematic sectional views showing the steps of the process of producing a semiconductor substrate of the present example.

Figure 8A:
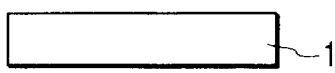
FIGS. 8A, 8B, 8C, 8D, 8E, 8F, 8G, 8H, 8I, 8J and 8K are schematic sectional views illustrating the steps of yet still another example of the process of producing a semiconductor article in accordance with the present invention.

As shown in FIG. 8A, a plurality of boron-doped p-type (100) 6-inch Si wafers with a resistivity range of 1–2 Ωcm made by the CZ method ware prepared as the single-crystal substrate 1. Of the wafers, one analyzed in one step was not subjected to the subsequent step and only those which were not analyzed in the former step were subjected to the subsequent step.

The wafers were placed in a vertical diffusion furnace and $POCl_3$ gas diluted with nitrogen was introduced into the furnace. In the furnace, the $POCl_3$ gas and oxygen were mixed and supplied on the wafer surface to form a phosphorus glass ($P_2O_5$—$SiO_2$) film (not shown) on the whole of the front and back surfaces of the wafers. Next, a heat treatment at 1000° C. for 30 minutes was carried out to diffuse phosphorus into the wafers, and the wafers were then put out from the furnace.

Figure 8B:
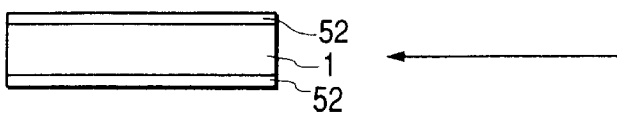
Figure 8C:
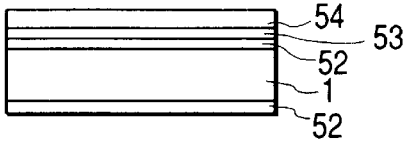

Then, the wafers were dipped in an HF solution for 10 minutes to peel off the phosphorus glass film and then fully cleaned with water and dried. When the wafers were measured by the SR method, it was observed that an n-type high concentration layer 52 with a carrier concentration of $5 \times 10^{18}/cm^3$ or more was formed on the front and back surfaces of the wafers (FIG. 8B).

On each of the wafers was formed a single-crystal semiconductor layer of 1.5 μm in thickness by the CVD method. By changing the concentration of the dopant during the growth, an n⁺⁺-type Si layer 54 of 0.01 Ωcm in resistivity was formed from the outermost surface to a depth of 0.5 μm, and an n⁻-type Si layer 53 of 0.5 Ωcm in resistivity was formed thereunder in a depth of 0.5 μm. Measurement in this state provided a total thickness of 627 μm.

Then, the wafers were set in an mixed solution of hydrofluoric acid and ethanol such that the single-crystal semiconductor layer formed side of the wafers formed an anode and the epitaxial growth layer side was made porous by anodization under the following anodization conditions while effecting light irradiation.

Current Density: 12 (mA/cm²)

Anodizing Solution: $HF:H_2O:C_2H_5OH=1:1:1$

Time: 5 min

Figure 8D:
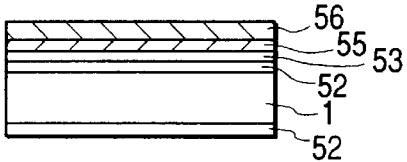

After the anodization, when sectional observation was carried out with a high resolution scanning electron microscope, it was confirmed that there was formed a low porosity layer 56 with about 20% porosity in a region extending from the outermost surface to a depth of 0.5 μm, there was formed thereunder a structurally fragile, high porosity layer 55 with about 40% porosity in a thickness of 0.4 μm, and the n⁺-type Si layer 53 remained thereunder (FIG. 8D). The porosities were determined by electron microscopic photographs. Then, the wafers were treated for 1 hour at 400° C. in oxygen atmosphere.

Subsequently, the wafers were dipped into an 1.25 wt. % aqueous solution of HF for 30 seconds, pulled up from the solution and rinsed with pure water for 10 minutes. Then, the wafers were put in an epitaxial growth apparatus and subjected to the following processes to epitaxially grow a non-porous single-crystal layer 3 made of single-crystal single-crystal in a thickness of 0.15 μm by the gas source MBE method under the following conditions.

(Pre-baking)

Temperature: 950° C.

Time: 60 sec (Epitaxial Growth)

Source Gas: $SiH_4$

Temperature: 850° C.

Figure 8E:
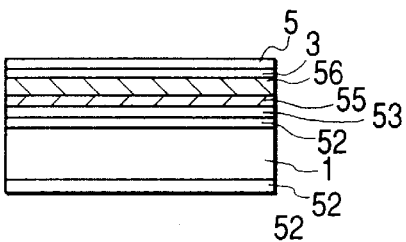
Figure 8F:
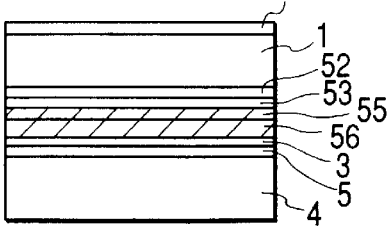

Then, on the surface of the single-crystal Si layer, an insulating layer 5 made of an $SiO_2$ layer of a thickness of 50 nm was formed by thermal oxidation at 800° C. (FIG. 8E). A surface of a separately prepared p-type (100) dummy silicon substrate (support substrate) 4 with a resisitivity of 1–100 Ωcm and the surface of the insulating layer 5 are subjected to chemical cleaning used in ordinary silicon device production processes, cleaned with water, dried, exposed to a nitrogen plasma for 1 minute, further cleaned with water, superposed upon each other, and bonded to each other (FIG. 8F).

Figure 8G:
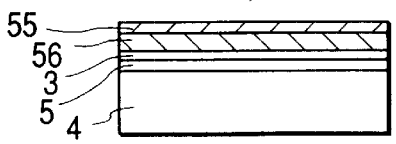
Figure 8H:
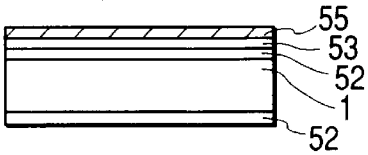

While rotating the bonded substrate with the center portion being held, pure water was jetted to its side surface having a recess formed by beveling of the wafer, the wafers began peeling off from each other at the high porosity layer 55 and the bonded wafer could finally be separated into tow members (FIGS. 8G and 8H).

Figure 8I:
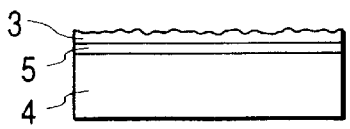

Subsequently, when the support substrate 4 was dipped in a mixture solution of hydrofluoric acid and hydrogen peroxide, the porous silicon layers 55, 56 remaining on the surface was removed in about 90 minutes to form an SOI wafer (FIG. 8I). Further, the surface of the SOI layer was dipped in an mixed solution of ammonia and hydrogen peroxide to be etched only in a thickness of 30 nm (FIG. 8J).

Further, the wafer was subjected to a heat treatment at 1050° C. for 1 hour in hydrogen atmosphere. The surface roughness evaluated by an atomic force microscope was 0.2 nm in terms of the mean square roughness in an area of 50 $\mu$m square, which was comparable to that of a commercially available Si wafer. Further, the crystal defect density was measured to show stacking fault density of 60/cm². Thus, there was obtained an SOI wafer having the single-crystal Si layer with a small defect density formed on the insulating layer 5.

Figure 8K:
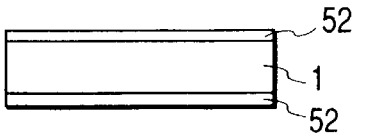
Figure 8J:
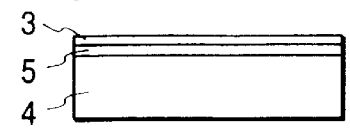

When the porous silicon layer 55 and the left portion 53 of the n⁻-type Si layer remaining on the p-type single-crystal Si substrate 1 side were dipped in a mixed solution of nitric acid, hydrofluoric and water, they were removed in about 60 minutes (FIG. 8K). When the thus obtained substrate was again put into the step shown in FIG. 8B as the p-type single-crystal Si substrate 1, there could be produced a second SOI wafer having the same quality as that of the firstly obtained SOI wafer.

When the surface after the removal of the porous layer was measured by an atomic force microscope, the surface roughness was as large as 10 nm in terms of the mean square roughness in an area of 1 $\mu$m square. However, when subjected to the epitaxial growth of n⁺-type layers (two layers) described at the beginning of the present example, the surface roughness was 0.17 nm, which showed a reduction to 1/50 or less. Further, carrying out the subsequent steps such as anodization, epitaxial growth, bonding, and so on could produced an SOI wafer again.

When the p-type single-crystal Si substrate 1 was reutilized five times, it was possible to carry out the steps as with the case of the original p-type single-crystal Si substrate 1 for each time of reutilization and to obtain 6 SOI wafers in total from 7 silicon wafers.

According to the above described examples, since a structure capable forming a porous structure is preliminarily formed in the epitaxial growth step in advance of the porous layer formation, it is possible in the porous layer forming step to form the multi-layer structure while keeping constant the forming conditions such as current or the like.

Further, since the porous layer is formed in the single-crystal semiconductor layer formed by epitaxial growth, it is possible to prevent that swirl which is characteristic of CZ substrates, etc. develops in the porous layer formation to cause bonding failure or the like when reutilized. Thus, the number of times of reutilization and the yield are significantly improved.

Example 5

FIGS. 9A to 9I are schematic sectional views showing the steps of the process of producing a semiconductor substrate of the present example.

Figure 9A:
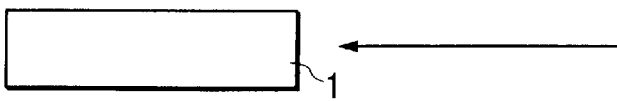
FIGS. 9A, 9B, 9C, 9D, 9E, 9F, 9G, 9H and 9I are schematic sectional views illustrating the steps of again, another example of the process of producing a semiconductor article in accordance with the present invention.
Figure 9B:
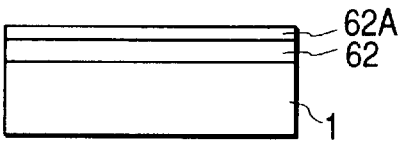

As shown in FIG. 9A, a plurality of p⁺-type (100) Si 5-inch wafers of a dummy grade with a resistivity range of 0.006–0.06 Ωcm made by the CZ method ware prepared as the single-crystal substrate 1. Of the wafers, one analyzed in one step was not subjected to the subsequent step and only those which were not analyzed were subjected to the subsequent step.

On each of the wafers was formed a single-crystal semiconductor layer 62 of 15 $\mu$m in thickness by the liquid phase epitaxial growth method. The melt was prepared by melting boron-doped p-type silicon of 0.01–0.02 Ωcm into an indium melt. The resistivity of the obtained single-crystal semiconductor layer 62 was measured by the SR method and found to be p-type silicon of 0.25 Ωcm in resistivity.

The wafers were heat treated at 1100° C. for 10 minutes in hydrogen atmosphere to diffuse out the boron at the surface side to thereby form a layer 62A with a resistivity of 0.05 Ωcm in the surface of the obtained single-crystal semiconductor layer 62. Then, the wafers were set in an mixed solution of hydrofluoric acid and ethanol such that the single-crystal semiconductor layers 62, 62A formed side of the wafers formed an anode and the single-crystal semiconductor layer 62 side was made porous by anodization under the following anodization conditions.

Figure 9C:
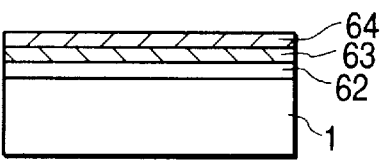

Current Density: 7 (mA/cm²)
Anodizing Solution: HF:H$_2$O:C$_2$H$_5$OH=1:1:1
Time: 9 min After the anodization, when sectional observation was carried out with a high resolution scanning electron microscope, it was confirmed that there was formed a structurally fragile, high porosity layer 64 with about 30% porosity in a region extending from the outermost surface to a depth of 0.5 $\mu$m, and there was formed thereunder a low porosity layer 63 with about 20% porosity in a thickness of 9 $\mu$m, as shown in FIG. 9C. The porosities were determined by electron microscopic photographs. Then, the wafers were treated for 1 hour at 400° C. in oxygen atmosphere.

Subsequently, the wafers were dipped into an 1.25 wt. % aqueous solution of HF for 30 seconds, pulled up from the solution and rinsed with pure water for 10 minutes. Then, the wafers were put in an epitaxial growth apparatus and subjected to hydrogen pre-baking, pre-injection and epitaxial growth by the CVD method in this order to epitaxially grow a single-crystal Si layer 3 in a thickness of 0.75 $\mu$m under the following conditions.

Figure 9D:
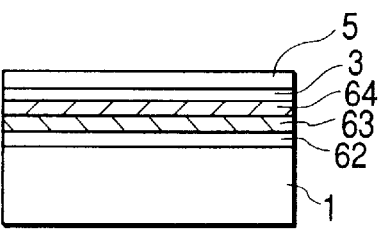

(Hydrogen Pre-baking)
Gas: H$_2$
Gas Flow Rate: 43 l/min
Temperature: 900° C.
Pressure: 400 Torr (ca. 5.3×10⁴ Pa)
Time: 60 sec (Pre-injection)
Source Gas: SiH$_4$/H$_2$
Gas Flow Rate: 0.015/43 l/min
Gas Pressure: 400 Torr (ca. 5.3×10⁴ Pa)
Temperature: 900° C.
Time: 200 sec (Epitaxial Growth)
Source Gas: SiH$_2$Cl$_2$/H$_2$
Gas Flow Rate: 0.15/43 l/min
Gas Pressure: 80 Torr (ca. 1.1×10⁴ Pa)
Temperature: 900° C.
Growth Rate: 0.2 $\mu$m/min When a substrate with the thickness of the single-crystal Si layer 3 of 2 μm was formed in the above described manner, subjected to the Seco etching, and observed with differential interference mode of an optical microscope to observe etch pits corresponding to stacking faults in a density of 400 cm$^{-2}$. Further, on the surface of the epitaxially grown single-crystal layer 3, an insulating layer 5 made of SiO$_2$ of a thickness of 500 nm was formed by thermal oxidation (FIG. 9D).

Figure 9E:
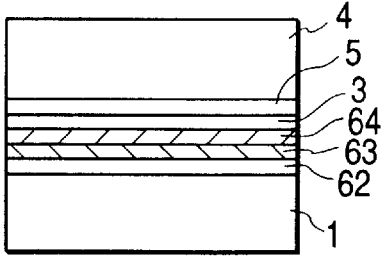

A surface of a separately prepared p-type (100) silicon wafer (support substrate) 4 of 8–12 Ωcm in resistivity and the surface of the insulating layer 5 are exposed to chemical cleaning used in ordinary silicon device production processes, cleaned with water, dried, brought into contact with each other, and bonded to each other. Then, a heat treatment at 1000° C. for 2 hours was effected to improve the bonding strength (FIG. 9E).

Figure 9F:
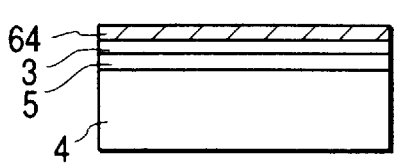
Figure 9H:
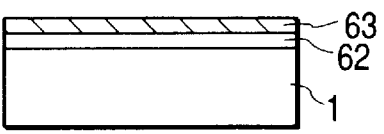

Separating the thus obtained bonded wafer resulted in division in the vicinity of the interface between the high porosity layer 64 and the low porosity region 63 (FIGS. 9F and 9H). As the separation methods, there can be used application of external force such as pressurizing, pulling, shearing, wedge insertion, etc., optical energy application, ultrasonic wave application, heat application, oxidation accompanied by circumferential expansion of the high porosity layer 63 and internal pressure application to the high porosity layer 63, pulse-wise heating, thermal stress application, softening, jetting water flow to the side surface of the bonded substrate, or the like.

Figure 9G:
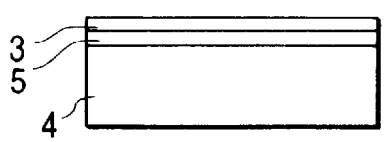

Subsequently, when the support substrate 4 was dipped in a mixture solution of HF and hydrogen peroxide, the porous layers 64 remaining on the surface was removed in about 30 minutes to form an SOI wafer. Further, the wafer was heat treated at 940° C. for 4 hours in hydrogen atmosphere (FIG. 9G).

The surface roughness evaluated by an atomic force microscope was 0.2 nm in terms of the mean square roughness in an area of 50 μm square, which was comparable to that of a commercially available Si wafer. Further, the crystal defect density was measured to show stacking fault density of 45/cm$^2$. Thus, there was obtained an SOI wafer having the single-crystal Si layer 3 with a small defect density formed on the insulating layer 5.

Figure 9I:

The porous silicon layer 63 remaining on the p-type single-crystal Si substrate 1 (FIG. 9H) was dipped in a mixture solution of hydrofluoric acid and hydrogen peroxide, it was removed in about 90 minutes. Then, the surface after the etching was polished in about 4 μm and smoothed (FIG. 9I). When the thus obtained substrate was again put into the step shown in FIG. 9A, there could be produced a second SOI wafer having the same quality as that of the firstly obtained SOI wafer.

When the p-type single-crystal Si substrate 1 was reutilized three times, it was possible to carry out the steps as with the case of the original p-type single-crystal Si substrate 1 for each time of reutilization and to obtain 4 SOI wafers in total from 5 silicon wafers.

Example 6

FIGS. 10A to 10I are schematic sectional views showing the steps of the process of producing a semiconductor substrate of the present example.

Figure 10A:
Figure 10B:
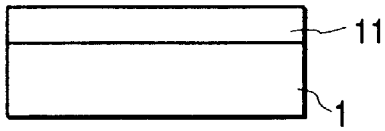

As shown in FIG. 10A, a p-type single-crystal Si substrate was prepared as the single-crystal substrate 1. On a surface of the substrate was epitaxially grown a single-crystal semiconductor layer 11 in a thickness of, e.g., 11 μm by the CVD method with addition of diborane (FIG. 10B). By adjusting the concentration of diborane as a dopant during the growth, a p$^{++}$-type Si layer 34 of 0.015 Ωcm in resistivity was formed. At this time, the whole thickness of the substrate was 634 μm. The p-type single-crystal Si substrate 1 having the epitaxial layer 11 formed thereon was set in an mixed solution of HF and ethanol and subjected to anodization under the following anodization conditions.

Figure 10C:
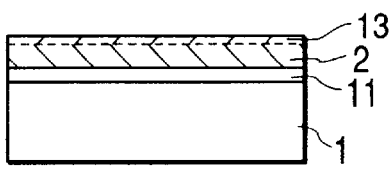

Current Density: 7 (mA/cm$^2$)
Anodizing Solution: HF:H$_2$O:C$_2$H$_5$OH=1:1:1
Time: 10 min After the anodization, when sectional observation was carried out with a high resolution scanning electron microscope, it was confirmed that there was formed a porous layer 2 with about 20% porosity in a region extending from the outermost surface to a depth of 10 μm (FIG. 10C).

After the wafer was treated for 1 hour at 400° C. in oxygen atmosphere and was dipped into an 1.25 wt. % aqueous solution of HF for 30 seconds to remove the very thin silicon oxide film (not shown) formed on the surface. Thus, there was formed on the surface side a layer 13 of a high porosity provided by removal of the silicon oxide film by the aqueous HF solution.

Figure 10D:
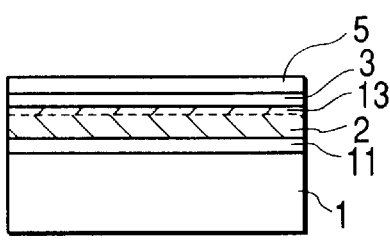
Figure 10E:
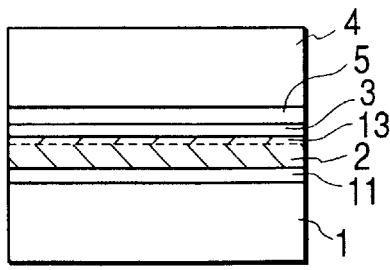

Further, there was present, at a region deeper than the high porosity layer, another porous layer which was not in contact with the aqueous HF solution and had the silicon oxide film at the inside walls of the pores thereof. This layer was a low porosity layer. Then, the wafer was put in an epitaxial growth apparatus and subjected to epitaxial growth by the CVD method of a single-crystal Si layer as the non-porous single-crystal layer 3 in a thickness of 0.3 μm under the following conditions.
(Epitaxial Growth)
Source Gas: SiH$_2$Cl$_2$/H$_2$
Gas Flow Rate: 0.2/180 l/min
Gas Pressure: 760 Torr (ca. 1.0×10$^5$ Pa)
Temperature: 1060° C.
Growth Rate: 0.15 μm/min Further, on the surface of the single-crystal Si layer 3, an insulating layer 5 made of SiO$_2$ of a thickness of 200 nm was formed by thermal oxidation at 800° C. (FIG. 10D). A surface of a separately prepared support substrate 4 made of silicon and the surface of the insulating layer 5 are superposed upon each other (FIG. 10E) and brought into contact with each other, which was followed by annealing at 1180° C. for 5 minutes, so that the bonding was made firm.

Separating the thus obtained bonded wafer resulted in division in the vicinity of the interface between the high porosity porous layer 13 and the underlying low porosity layer (FIGS. 10F and 10H). As the separation methods, there can be used application of external force such as pressurizing, pulling, shearing, wedge insertion, etc., optical energy application, ultrasonic wave application, heat application, oxidation accompanied by circumferential expansion of the high porosity layer 13 and internal pressure application to the high porosity layer 13, pulse-wise heating, thermal stress application, softening, jetting water flow to the side surface of the bonded wafer, or the like.

Subsequently, when the support substrate 4 was dipped in a mixture solution of HF and hydrogen peroxide, the porous layers 13 remaining on the surface was removed in about 60 minutes to form an SOI wafer (FIG. 10G). Further, the wafer was heat treated in hydrogen atmosphere at 1100° C. for 4 hours.

The surface roughness evaluated by an atomic force microscope was 0.2 nm in terms of the mean square roughness in an area of 50 μm square, which was comparable to that of a commercially available Si wafer. Further, the crystal defect density was measured to show stacking fault density of 50/cm². Thus, there was formed an SOI wafer having a single-crystal Si layer 3 with a small defect density on the SiO₂ layer 5.

The porous silicon layer 12 and the epitaxial growth layer 11 remaining on the substrate 1 side were dipped in a mixture solution of HF and hydrogen peroxide to be removed (FIG. 10I).

When the surface of the substrate was measured by at atomic force microscope, the surface roughness was 10 nm in terms of the mean square roughness in an area of 1 μm square, which was nearly 100 times the roughness 0.13 nm of the silicon wafer surface. However, when subjected again to the epitaxial growth step (FIG. 10B) for forming the p⁺-type silicon layer described at the beginning of the present example, the surface roughness in terms of the mean square roughness was reduced to 0.14 nm. Thus, the substrate could be used again to be subjected to the step of FIG. 10C and the subsequent steps, thus providing an SOI wafer (FIG. 10G). Further, the thickness of the wafer was 634.3 μm and was not substantially changed from that of the wafer after the first epitaxial growth.

When the p-type single-crystal Si substrate 1 was reutilized ten times, it was possible to carry out the steps as with the case of the original p-type single-crystal Si substrate 1 for each time of reutilization and to obtain 11 SOI wafers in total from 12 silicon wafers. In the present example, the change of the wafer thickness is especially small, even when subjected to reutilization up to 10 times, the substrate can be processed without changing the conditions of the steps from those for processing the firstly reclaimed wafer, so that complicatedness when reutilizing a number of wafers was not brought about at all.

Example 7

The process of producing a semiconductor substrate of the present example is described with reference to FIGS. 11A and 11C to 11L.

Figure 11A:
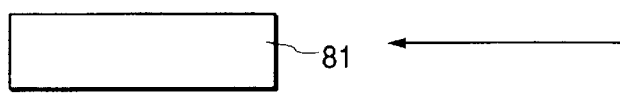
FIGS. 11A, 11C, 11D, 11E, 11F, 11G, 11H, 11I, 11J, 11K and 11L are schematic sectional views illustrating the steps of yet again another example of the process of producing a semiconductor article in accordance with the present invention.
Figure 11C:
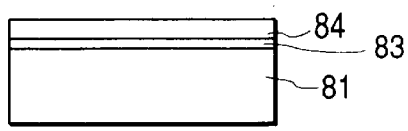

As shown in FIG. 11A, a p-type (100) dummy grade Si wafer of a resistivity range of 1–100 Ωcm made by, e.g., the CZ method was provided as the single-crystal substrate 81. On the wafer was formed an epitaxial silicon layer in a thickness of 5 μm (FIG. 11C) by, e.g., the CVD method. During the CVD method, by changing the concentration of diborane as a dopant to a larger one, a p⁺⁺-type Si layer 84 of 0.015 Ωcm in resistivity was formed in a thickness of 4 μm at the surface side, and a p⁻-type Si layer 83 of 2 Ωcm in resistivity was formed in a thickness of 2 μm thereunder.

Then, the wafer was set in an mixed solution of HF and ethanol such that the epitaxial layers 83, 84 formed side of the wafers formed on anode and the epitaxial layers 83, 84 formed side was made porous by anodization under the same and constant conditions.

Figure 11D:
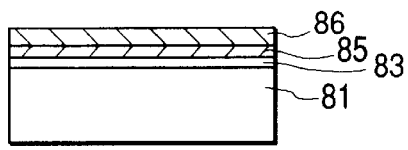

After the anodization, there was formed a low porosity layer 86 with about 20% porosity in a region extending from the outermost surface to a depth of 4 μm, there was formed thereunder a structurally fragile, high porosity layer 85 with about 50% porosity in a thickness of 0.5 μm, and a part of the epitaxial layer 83 remained thereunder (FIG. 11D). Then, the wafer was treated for 2 hours at 300° C. in oxygen atmosphere.

Further, the wafer was dipped in an aqueous HF solution, pulled up from the solution, and rinsed with pure water. Then, the wafer was put in an epitaxial growth apparatus, and a single-crystal Si layer 87 was epitaxially grown in a thickness of 0.21 μm by the CVD method.

Figure 11E:
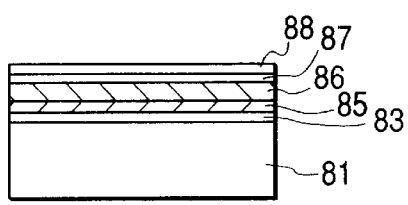
Figure 11F:
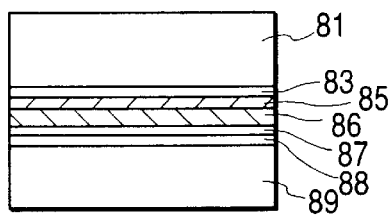

Then, on the surface of the epitaxial layer 87, an SiO₂ layer 88 of a thickness of 50 nm was formed by thermal oxidation (FIG. 11E). A surface of a separately prepared support substrate 89 such as a quartz substrate, Si substrate or Si substrate having SiO₂ formed on its surface and the surface of the SiO₂ layer 88 are bonded to each other (FIG. 11F). At this time, if necessary, the surfaces may be exposed to a nitrogen plasma, then cleaned with water, dried, superposed upon each other, and bonded to each other. Further, the bonded substrate may be heat treated at about 400–1100° C. for 1 hour to improve the bonding strength.

Figure 11G:
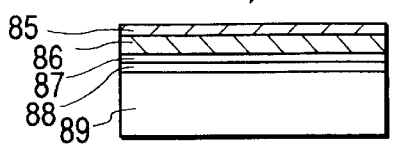
Figure 11H:
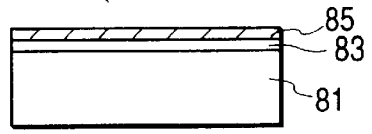

By breaking at least one of the inside and the upper and lower interfaces of the high porosity layer 85, the bonded substrate was separated (FIGS. 11G and 11H). As the separation methods, there can be used application of external force such as pressurizing, pulling, shearing, wedge insertion, etc., optical energy application, ultrasonic wave application, heat application, oxidation accompanied by circumferential expansion of the high porosity layer 85 and internal pressure application to the high porosity layer 85, pulse-wise heating, thermal stress application, softening, jetting water flow to the side surface of the bonded substrate, or the like.

Figure 11I:
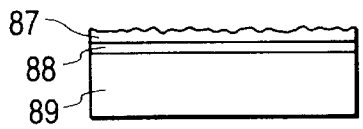

Subsequently, the support substrate 89 was dipped in a mixture solution of HF and hydrogen peroxide to remove the porous layers 85, 86 remaining on the surface, thus forming an SOI wafer (FIG. 11I).

Further, a heat treatment at, e.g., 940° C. for 4 hours was carried out in hydrogen atmosphere to smooth the surface of the single-crystal Si layer 87. Thus, there was obtained the single-crystal Si layer 87 of a small defect density on the SiO₂ layer 88 (FIG. 11J).

Figure 11K:
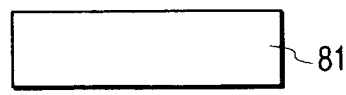
Figure 11J:
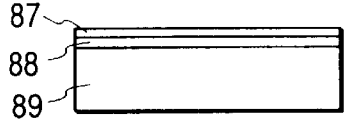
Figure 11L:
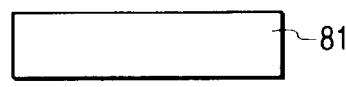
Figure 12A:
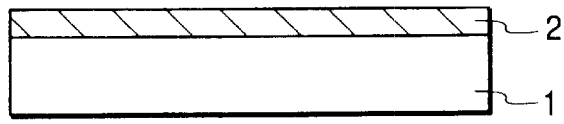
FIGS. 12A, 12B, 12C, 12D and 12E are schematic sectional views illustrating the steps of a process of producing a semiconductor article of the prior art.
Figure 12B:
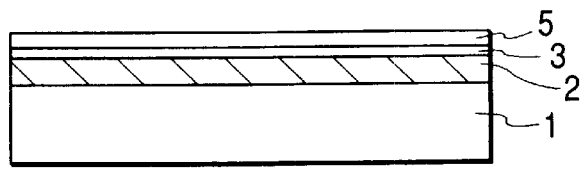
Figure 12C:
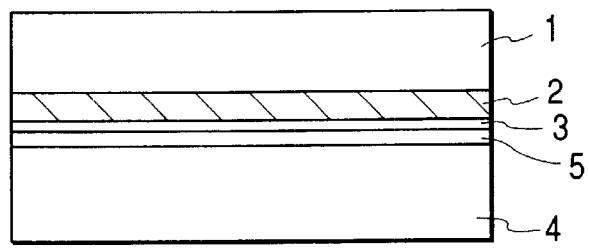
Figure 12D:
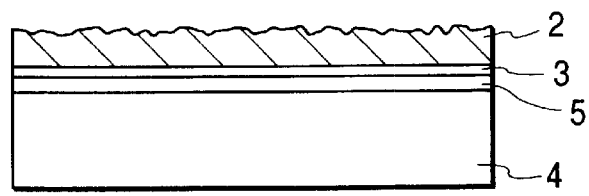
Figure 12E:
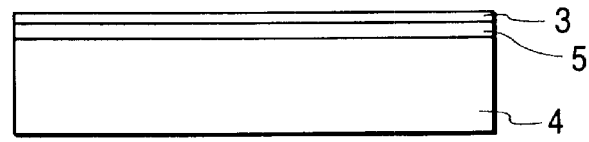
Figure 13A:
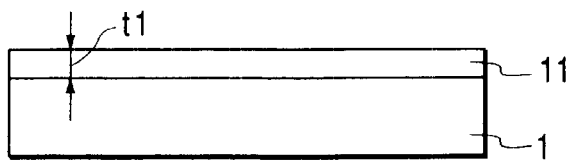
FIGS. 13A, 13B, 13C, 13D and 13E are schematic sectional views illustrating the steps of another process of producing a semiconductor article of the prior art.
Figure 13B:
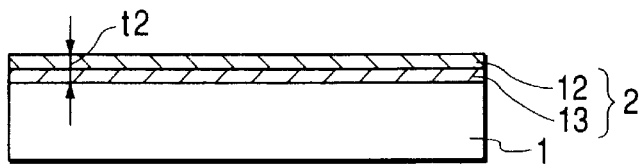
Figure 13C:
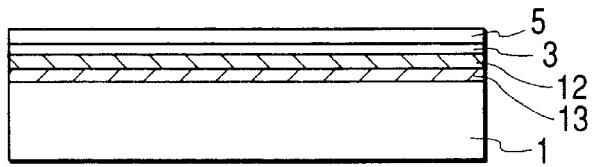
Figure 13D:
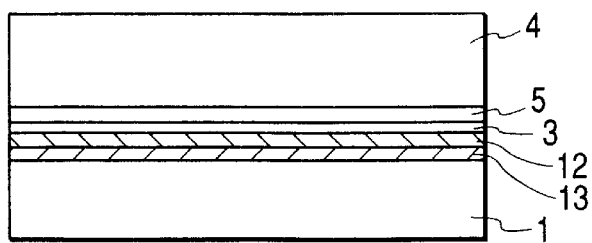
Figure 13E:
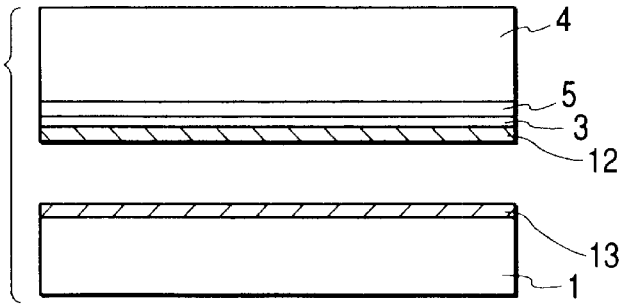
Figure 14A:
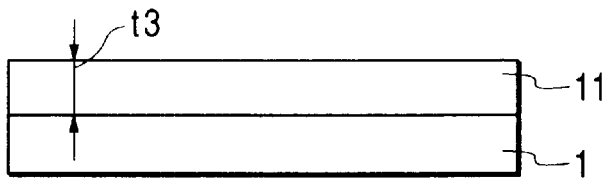
FIGS. 14A, 14B, 14C, 14D and 14E are schematic sectional views illustrating the steps of still another process of producing a semiconductor article.
Figure 14B:
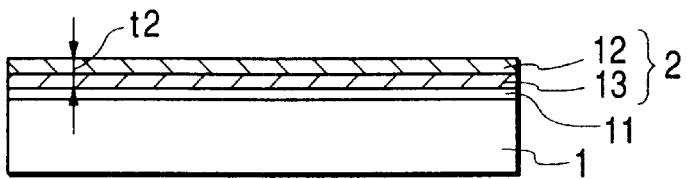
Figure 14C:
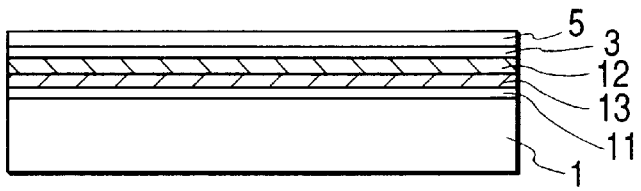
Figure 14D:
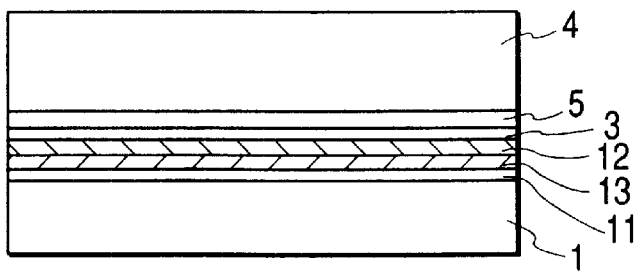
Figure 14E:
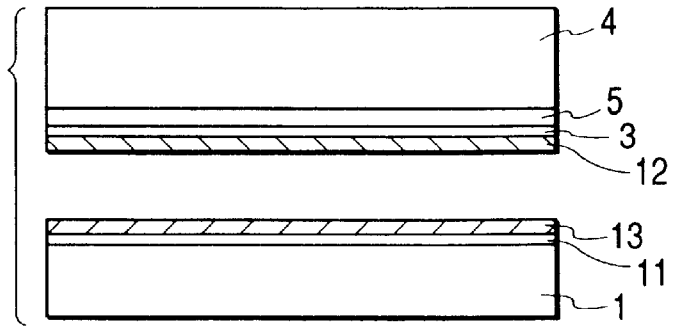

The porous silicon layer 85 and the p⁻-type Si layer 83 remaining on the first substrate 81 were dipped in an aqueous mixed solution of HF, nitric acid and acetic acid to be removed (FIG. 11K). Then, the surface of the first substrate 81 after etching was polished to be smoothed (FIG. 11L). The thus obtained substrate was again used and put into the step shown in FIG. 11A as the first substrate 81 for producing another SOI wafer.

What is claimed is:

1. A process of producing a semiconductor article comprising the steps of:

epitaxially growing on at least one surface of a single-crystal substrate a plurality of single-crystal semiconductor layers comprising a first single-crystal semiconductor layer and a second single-crystal semiconductor layer and differing from each other in at least one of the kind and the concentration of an impurity;

making porous the plurality of single-crystal semiconductor layers so as to form a high porosity layer in the first single-crystal semiconductor layer and a low porosity layer in the second single-crystal semiconductor layer;

subsequently forming a non-porous single-crystal layer on a surface of the single-crystal semiconductor layers as made porous; and bonding the single-crystal substrate and a support substrate to each other, wherein the bonded single-crystal substrate and support substrate are separated at at least one of a location in the high porosity layer and an interface of the high porosity layer with a layer adjacent thereto.

2. The process according to claim 1, wherein a plurality of single-crystal semiconductor layers differing from each other in at least one of the kind and the concentration of an impurity are again epitaxially grown on the single-crystal substrate obtained by removing the high porosity layer remaining on the side of the separated single-crystal substrate.

3. The process according to claim 1, wherein the single-crystal substrate is a semiconductor substrate.

4. The process according to claim 3, wherein the semiconductor substrate is a silicon substrate.

5. The process according to claim 1, wherein the low porosity layer is formed in the surface of the single-crystal semiconductor layer and the high porosity layer is formed under the low porosity layer.

6. The process according to claim 5, wherein the thickness of the low porosity layer is 20 µm or less.

7. The process according to claim 1, wherein a low impurity concentration layer is formed on the single-crystal substrate and a high impurity concentration layer is formed thereon.

8. The process according to claim 1, wherein the resistivity $\rho 1$ of the low porosity layer and the resistivity $\rho 2$ of the high porosity layer satisfy the relationship of $\rho 1 < \rho 2$.

9. The process according to claim 8, wherein the resistivity $\rho 1$ of the low porosity layer satisfies $0.001 \ \Omega cm < \rho 1 \leq 0.1 \ \Omega cm$.

10. The process according to claim 8, wherein the resistivity $\rho 1$ of the low porosity layer satisfies $0.005 \ \Omega cm < \rho 1 \leq 0.02 \ \Omega cm$.

11. The process according to claim 8, wherein the resistivity $\rho 2$ of the high porosity layer satisfies $0.02 \ \Omega cm < \rho 2 \leq 10000 \ \Omega cm$.

12. The process according to claim 8, wherein the resistivity $\rho 2$ of the high porosity layer satisfies $0.1 \ \Omega cm < \rho 2 \leq 100 \ \Omega cm$.

13. The process according to claim 1 or 2, wherein the separated single-crystal substrate is subjected to smoothing to be reutilized.

14. The process according to claim 13, wherein the smoothing is carried out after the step of removing the remaining high porosity layer.

15. The process according to claim 14, wherein the smoothing is a heat treatment in a reducing atmosphere comprising hydrogen.

16. The process according to claim 1, wherein the single-crystal semiconductor substrate is grown by chemical vapor deposition.

17. The process according to claim 1, wherein the bonding step comprises bonding the non-porous single-crystal layer and the support substrate to each other with an insulating layer therebetween.

18. The process according to claim 1, wherein the non-porous single-crystal layer is a semiconductor layer.

19. The process according to claim 18, wherein the semiconductor layer is a silicon layer.

20. The process according to claim 1, wherein the single-crystal substrate and the support substrate are separated by applying an external force to the bonded substrate.

21. The process according to claim 1, wherein the single-crystal substrate and the support substrate are separated by inserting into the bonded substrate at least one of a solid wedge and a fluid wedge.

22. The process according to claim 1, wherein the single-crystal substrate and the support substrate are separated by generating an internal stress in the bonded substrate.

23. The process according to claim 1, wherein the single-crystal substrate and the support substrate are separated by externally applying to the bonded substrate at least one of a thermal energy and an optical energy.

24. The process according to claim 1, wherein the single-crystal substrate and the support substrate are separated by jetting a fluid to a recess of the bonded substrate.

25. The process according to claim 1, wherein the single-crystal substrate and the support substrate are separated by attaching a jig to the bonded substrate and applying a mechanical force to the jig.

26. The process according to claim 1, wherein the separated single-crystal substrate is reutilized and subjected to the processing of the respective steps of claim 1 to produce a semiconductor article.

27. The process according to claim 1, wherein anodization is carried out such that the single-crystal semiconductor layer remains non-porous under the high porosity layer.

28. The process according to claim 1, wherein the thickness of the low porosity layer is different from that of the high porosity layer.

29. The process according to claim 5, wherein a porous layer with a porosity higher than the porosity of the high porosity layer is further formed under the high porosity layer.

30. The process according to claim 1, further comprising the step of heat treating the porous layer in an oxidizing atmosphere to form a protective film on the walls in the pores.

31. The process according to claim 1, further comprising the step of heat treating the porous layer in a reducing atmosphere comprising hydrogen, prior to the step of forming the non-porous single-crystal layer.

32. The process according to claim 1, wherein anodization is carried out while allowing a constant current to flow to thereby make the single-crystal semiconductor layer porous.

33. A process of producing a semiconductor article comprising the steps of:

epitaxially growing a single-crystal semiconductor layer on at least one surface of a single-crystal substrate;

making porous the single-crystal semiconductor layer to form a high porosity layer and a low porosity layer;

forming a non-porous single-crystal layer on a surface of the high porosity layer; and bonding the single-crystal substrate and a support substrate to each other, wherein the bonded single-crystal substrate and support substrate are separated at at least one of a location in the high porosity layer and an interface of the high porosity layer with a layer adjacent thereto.

34. The process according to claim 33, further comprising the step of oxidizing the inside wall surfaces of the high porosity layer and then removing an oxide film on the layer surface side.

35. A process of producing a semiconductor article comprising the steps of:

epitaxially growing a single-crystal semiconductor layer on at least one surface of a single-crystal substrate;

effecting heat treatment in a reducing atmosphere comprising hydrogen and then making porous the single-crystal semiconductor layer so as to form a high porosity layer and a low porosity layer;

forming a non-porous single-crystal layer on a surface of the high porosity layer; and bonding the single-crystal substrate and a support substrate to each other, wherein the bonded single-crystal substrate and support substrate are separated at at least one of a location in the high porosity layer and an interface of the high porosity layer with a layer adjacent thereto.

36. The process according to claim 35, wherein a low impurity concentration layer for forming the high porosity layer is formed by the heat treatment in the surface of the single-crystal semiconductor layer.

* * * * *

UNITED STATES PATENT AND TRADEMARK OFFICE
CERTIFICATE OF CORRECTION

PATENT NO. : 6,375,738 B1
DATED : April 23, 2002
INVENTOR(S) : Nobuhiko Sato

It is certified that error appears in the above-identified patent and that said Letters Patent is hereby corrected as shown below:

Column 1,
Line 43, "an" should read -- a --.

Column 2,
Line 38, "results" should read -- result --.

Column 5,
Line 36, close up right margin; and
Lines 37 through and including line 45, close up left margin.

Column 8,
Line 23, "100 μnm." should read -- 100 nm. --;
Line 38, "the" should read -- that --; and
Line 67, "etc" should read -- etc. --.

Column 9,
Line 51, "above described" should read -- above-described --.

Column 11,
Line 2, "holden" should read -- held --;
Line 23, "preliminary" should read -- preliminarily --;
Line 30, "tow" should read -- two --; and
Line 62, "above mentioned" should read -- above-mentioned --.

Column 12,
Line 27, "contributes" should read -- contributes to --.

Column 13,
Line 13, "Depending" should read -- Depending on --; and
Line 45, "above mentioned" should read -- above-mentioned --.

Column 14,
Line 23, "anther" should read -- another --.

Column 15,
Line 4, "that" should read -- than --;
Line 43, "Depending" should read -- Depending on --; and
Line 60, "This," should read -- Thus --.

UNITED STATES PATENT AND TRADEMARK OFFICE
CERTIFICATE OF CORRECTION

PATENT NO. : 6,375,738 B1
DATED : April 23, 2002
INVENTOR(S) : Nobuhiko Sato

It is certified that error appears in the above-identified patent and that said Letters Patent is hereby corrected as shown below:

Column 17,
Line 34, "above described" should read -- above-decribed --; and
"was" should read -- were --; and
Line 59, "the" should read -- The --.

Column 18,
Line 7, "an" should read -- a --.

Column 19,
Line 2, "above described" should read -- above-described --; and
Line 67, "ware" should read -- were --.

Column 20,
Line 63, "above described" should read -- above-described --.

Column 21,
Line 13, "tow" should read -- two --;
Line 17, "was" should read -- were --; and
Line 48, "produced" should read -- produce --.

Column 22,
Line 23, "an" should read -- a --; and
Line 50, "single-crystal" should be deleted.

Column 23,
Line 7, "tow" should read -- two --;
Line 14, "an" should read -- a --;
Line 44, "produced" should read -- produce --;
Line 50, "above described" should read -- above-described --;
Line 51, "capable" should read -- capable of --; and
Line 59, "develops" should read -- from developing --.

Column 25,
Line 2, "above described" should read -- above-described --.

UNITED STATES PATENT AND TRADEMARK OFFICE
CERTIFICATE OF CORRECTION

PATENT NO. : 6,375,738 B1
DATED : April 23, 2002
INVENTOR(S) : Nobuhiko Sato

It is certified that error appears in the above-identified patent and that said Letters Patent is hereby corrected as shown below:

Column 26,
Line 5, "an" should read -- a --; and
Line 16, "After" should read -- After that --.

Column 27,
Line 10, "at" should read -- an --; and
Line 49, "an" should read -- a --.

Signed and Sealed this

Twenty-fifth Day of February, 2003

JAMES E. ROGAN
*Director of the United States Patent and Trademark Office*